(12) United States Patent
Tateishi et al.

(10) Patent No.: US 8,205,625 B2
(45) Date of Patent: Jun. 26, 2012

(54) APPARATUS AND METHOD FOR SURFACE TREATMENT OF SUBSTRATE, AND SUBSTRATE PROCESSING APPARATUS AND METHOD

(75) Inventors: Hideki Tateishi, Tokyo (JP); Tsutomu Nakada, Tokyo (JP); Akira Susaki, Tokyo (JP); Shohei Shima, Tokyo (JP); Yukio Fukunaga, Tokyo (JP)

(73) Assignee: Ebara Corporation, Tokyo (JP)

( * ) Notice: Subject to any disclaimer, the term of this patent is extended or adjusted under 35 U.S.C. 154(b) by 1244 days.

(21) Appl. No.: 11/987,078

(22) Filed: Nov. 27, 2007

(65) Prior Publication Data

US 2008/0124932 A1 May 29, 2008

(30) Foreign Application Priority Data

Nov. 28, 2006 (JP) ................... 2006-319581
May 17, 2007 (JP) ................... 2007-131594
Aug. 30, 2007 (JP) ................... 2007-223941

(51) Int. Cl.
*B08B 5/00* (2006.01)
*B08B 13/00* (2006.01)

(52) U.S. Cl. . 134/95.1; 134/94.1; 134/105; 156/345.12; 438/691

(58) Field of Classification Search .................. 134/19, 134/94.1, 95.1, 95.2, 105; 156/345.12; 438/691, 438/752, 962
See application file for complete search history.

(56) References Cited

U.S. PATENT DOCUMENTS

| | | | |
|---|---|---|---|
| 6,333,268 B1 * | 12/2001 | Starov et al. ............. | 438/691 |
| 6,494,985 B1 * | 12/2002 | Sotozaki et al. ......... | 156/345.12 |
| 6,746,967 B2 * | 6/2004 | Brask et al. ............. | 438/752 |
| 7,064,070 B2 * | 6/2006 | Mullee et al. ........... | 438/691 |
| 2005/0191858 A1 | 9/2005 | Fukunaga et al. | |

* cited by examiner

*Primary Examiner* — Michael Barr
*Assistant Examiner* — Benjamin Osterhout
(74) *Attorney, Agent, or Firm* — Wenderoth, Lind & Ponack, L.L.P.

(57) ABSTRACT

A surface treatment apparatus of a substrate can clean a substrate surface in the air without employing a vacuum apparatus, and can remove a natural oxide film or an organic material, such as BTA, from the substrate surface without resorting to plasma cleaning. The surface treatment apparatus includes: an inert gas supply section for supplying an inert gas to the whole or part of a substrate surface to form an oxygen-blocking zone; a heating section for keeping the substrate surface at a predetermined temperature; and a cleaning gas supply section for supplying a cleaning gas to the oxygen-blocking zone to clean the substrate surface.

5 Claims, 14 Drawing Sheets

APPARATUS AND METHOD FOR SURFACE TREATMENT OF SUBSTRATE, AND SUBSTRATE PROCESSING APPARATUS AND METHOD

BACKGROUND OF THE INVENTION

1. Field of the Invention

The present invention relates to an apparatus and method for surface treatment of a substrate, which is useful for removing contaminants, such as an organic material, an oxide on a metal surface, etc., from a surface of a substrate, such as a semiconductor wafer, to clean the substrate surface in a semiconductor device manufacturing process. The present invention also relates to a substrate processing apparatus and method for polishing a surface of a substrate into a flat mirror-like surface.

2. Description of the Related Art

It has been confirmed that an organic material present on a surface of a substrate, such as a semiconductor wafer, or a natural oxide film produced on surfaces of copper interconnects formed in the surface of the substrate, can be removed by a method comprising vacuum-evacuating a chamber containing therein the substrate, and then putting the substrate in a formic acid gas atmosphere at a gas pressure of not less than 40 Pa while heating the substrate at a temperature of not less than 130° C. An exemplary processing time is about 0.1 minute when the formic acid gas pressure is 400 Pa and the substrate temperature is 200° C.

In a semiconductor device manufacturing process, a cleaning treatment of a substrate surface is sometimes necessary before or after an atmospheric processing of the substrate, such as chemical mechanical polishing (CMP) or plating, carried out in the air. For example, a process as shown in FIG. 1 is widely practiced in which a lower-level interconnect film of, e.g., copper is formed by plating on a surface of a substrate, and a surface of the lower-level interconnect film is polished and flattened by CMP to form lower-level interconnects. Thereafter, an insulating film is deposited over the substrate surface, and trenches are formed in the insulating film, and then a barrier metal film is formed over the substrate surface. Thereafter, an upper-level interconnect film of, e.g., copper is formed by plating on a surface of the barrier metal film, followed by CMP to polish and flatten a surface of the upper-level interconnect film, thereby forming upper-level interconnects.

In the above process, a natural oxide film can form on surfaces of the lower-level interconnects prior to the formation of the upper-level interconnects, and an organic material, such as benzotriazole (BTA) used in CMP process to prevent corrosion of copper as an interconnect material, can remain on the substrate surface. The natural oxide film and the organic material both have an inhibitory influence on the electrical connection between the upper-level interconnects and the lower-level interconnects.

It is therefore a conventional practice to remove such a natural oxide film formed on surfaces of interconnects by, for example, plasma cleaning.

With the recent progress toward higher integration of semiconductor devices, the circuit interconnects are becoming finer and the distance between adjacent interconnects is becoming smaller. Especially when forming a circuit pattern by optical lithography with a line width of not more than 0.5 μm, a stepper requires a high flatness of imaging surface because of the small depth of focus. A chemical mechanical polishing apparatus for carrying out chemical mechanical polishing (CMP) is known as a means for flattening a surface of such a semiconductor substrate.

A common chemical mechanical polishing (CMP) apparatus includes a polishing table having a polishing pad on an upper surface, and a top ring, and is designed to polish a surface of a substrate (wafer) into a flat mirror-like surface by pressing the substrate on the polishing table by the top ring while supplying an abrasive liquid (slurry) to the surface of the polishing pad.

When flattening a metal film, formed on a surface of a substrate, by chemical mechanical polishing, it is a conventional practice to oxidize the metal film with an oxidizing agent in a slurry and instantaneously convert the oxidized film into an insoluble complex with a chelating agent in the slurry, and polish away the complex, e.g., with abrasive grains in the slurry.

When a metal film such as copper is formed on a surface of a substrate, there is a case where a natural oxide film grows on the metal film by the moisture or oxygen in the air. The formation of a natural oxide film on a metal film hinders complexing of the substrate surface with a chelating agent. A natural oxide film per se is harder to polish than a complex. Accordingly, in chemical mechanical polishing of a substrate surface in which a natural oxide film having a non-uniform thickness is formed, there is often a case where polishing does not progress locally whereby uniform flattening of the substrate surface cannot be achieved.

In order to polish a metal film formed on a substrate after removing a natural oxide film on the metal film so as to achieve uniform flattening of the substrate surface, a method has been proposed in which prior to flattening polishing processing, a natural oxide film is removed from the substrate surface by an oxide film removal processing unit constructed integrally with a flattening processing unit (see, for example, Japanese Patent Laid-Open Publication No. 2005-277396). The patent document discloses as the oxide film removal processing unit a wet processing unit using an acidic chemical solution and a dry processing unit which carries out reduction or etching of an oxide film in a vacuum apparatus.

There is also a report that when a natural oxide film on a copper surface is cleaned off by using formic acid gas and the sample is then left to stand in the air, a natural oxide film having a thickness of about 0.5 nm is produced on the copper surface in 3 minutes and 40 seconds after the cleaning (see Suzaki et al., "Growth of natural oxide film on Cu surface and removal of oxide film with formic acid gas", Collected Papers on 2005 Autumn Lecture Meeting of Japan Society of Applied Physics, Sep. 7, 2005, vol. 2, p. 705).

The above-described methods for surface treatment of a substrate have the following drawbacks: The method of treating a substrate surface in a vacuum necessitates a vacuum vessel and a vacuum evacuation means, thus requiring the use of a larger-sized processing apparatus. In addition, the method requires the step of vacuum-evacuating a vacuum vessel and the step of returning the vessel to atmospheric pressure, resulting in a considerably long processing time.

With regard to plasma cleaning of a substrate surface to remove a natural oxide film from the substrate surface, damage to a semiconductor device by plasma treatment becomes marked as interconnects become finer. Furthermore, there is presently no effective measure to remove BTA remaining on a substrate surface. A strong demand therefore exists for the development of a method for surface treatment of a substrate, which takes the place of plasma cleaning and can remove BTA from a substrate surface.

When a natural oxide film on a substrate surface is removed by a wet treatment using an acidic chemical solution, a functional device formed in the substrate can be damaged by the treatment. It is therefore desirable not to use such a wet treatment for an oxide film removal of a highly-integrated semiconductor. On the other hand, in the case of a dry treatment to remove a natural oxide film from a substrate surface using a vacuum apparatus, the treatment generally needs the use of three vacuum chambers, i.e., a vacuum treatment chamber and two spare vacuum chambers (load-lock chambers) for carrying in and out a substrate before and after the treatment, and a vacuum pump. A large-sized oxide film removal apparatus for carrying out the dry treatment is thus needed, and it is practically difficult to incorporate such a large apparatus into a chemical mechanical polishing apparatus.

SUMMARY OF THE INVENTION

The present invention has been made in view of the above situation in the related art. It is therefore a first object of the present invention to provide an apparatus and method for surface treatment of a substrate, which does not employ a vacuum apparatus and which can clean a substrate surface in the air, and which can simultaneously remove a natural oxide film and an organic material, such as BTA, from the substrate surface without resorting to plasma cleaning.

It is a second object of the present invention to provide a substrate processing apparatus and method which can remove a natural oxide film on a metal film formed on a substrate surface by dry treatment in the air, and can carry out chemical mechanical polishing of the metal film immediately after the surface treatment, thereby achieving uniform flattening of the substrate surface.

In order to achieve the above objects, the present invention provides an apparatus for surface treatment of a substrate, comprising: an inert gas supply section for supplying an inert gas to the whole or part of a substrate surface to form an oxygen-blocking zone; a heating section for keeping the substrate surface at a predetermined temperature; and a cleaning gas supply section for supplying a cleaning gas to the oxygen-blocking zone to clean the substrate surface.

According to the surface treatment apparatus of the present invention, an oxygen-blocking zone can be formed by supplying an inert gas to the whole or part of a substrate surface, and cleaning of the substrate surface can be carried out by supplying a cleaning gas to the oxygen-blocking zone while keeping the substrate at a predetermined temperature. The atmosphere on the substrate during the cleaning treatment consists solely of the inert gas and the cleaning gas, containing substantially no oxygen, and the pressure is approximately atmospheric pressure. Therefore, the surface treatment (cleaning) of the substrate can be carried out subsequently to an atmospheric processing of the substrate.

Preferably, the surface treatment apparatus further comprises a cooling section for cooling the substrate after the cleaning of the substrate surface.

The substrate after cleaning of the surface can be taken out of the apparatus and transported for the next process after cooling the substrate to, e.g., 50° C. by the cooling section.

Preferably, the cleaning gas is a carboxylic acid gas or a reducing gas.

A carboxylic acid, such as formic acid, acetic acid or propionic acid, is relatively inexpensive, easy to handle because it is liquid at room temperature, and can be reacted with an organic material or an oxide to make it vaporize. The use as a cleaning gas of a carboxylic acid, especially formic acid, acetic acid or propionic acid, can therefore remove an organic material or an oxide by volatilization, sublimation or decomposition easily at a low cost. Hydrogen gas, for example, can be used as the reducing gas.

Preferably, the surface treatment apparatus further comprises a gas flow regulating mechanism for regulating the flow of the cleaning gas supplied to the oxygen-blocking zone, and a gas discharge section for discharging gas from the gas flow regulating mechanism.

The gas flow regulating mechanism can regulate the flow of the cleaning gas supplied to the oxygen-blocking zone, thereby preventing the cleaning gas from flowing out of the apparatus.

The present invention also provides a method for surface treatment of a substrate, comprising: supplying an inert gas to the whole or part of a substrate surface to form an oxygen-blocking zone while keeping the substrate surface at a predetermined temperature; and supplying a cleaning gas to the oxygen-blocking zone to clean the substrate surface.

The substrate after the cleaning of the substrate surface may be cooled.

Preferably, the substrate after the cleaning of the substrate surface is cooled while supplying an inert gas to the substrate surface.

This can prevent re-oxidation of the cleaned substrate surface which is generally more active after the cleaning treatment than before the cleaning treatment.

The cleaning gas preferably is a carboxylic acid gas or a reducing gas.

The cleaning of the substrate surface is preferably carried out under approximately atmospheric pressure.

The cleaning of the substrate surface is preferably carried out while keeping the substrate at a temperature of not less than 120° C.

The cleaning of the substrate surface is preferably carried out for not less than 0.5 minute.

The present invention also provides a substrate processing apparatus, comprising: any one of the above-described surface treatment apparatuses; a chemical mechanical polishing apparatus for carrying out chemical mechanical polishing of a substrate surface; and a transport mechanism for transporting the substrate between the surface treatment apparatus and the chemical mechanical polishing apparatus.

This substrate processing apparatus makes it possible to remove a natural oxide film on a metal film formed in a substrate surface by dry treatment in the air, and to carry out chemical mechanical polishing of the metal film immediately after the surface treatment, while the apparatus can be made small-sized by the combination of the chemical mechanical polishing apparatus with the surface treatment apparatus which can be made small-sized.

The surface treatment apparatus and the chemical mechanical polishing apparatus may be disposed in a common apparatus frame.

Alternatively, the surface treatment apparatus and the chemical mechanical polishing apparatus may be constructed separately and disposed at a distance from each other.

The surface treatment apparatus and the chemical mechanical polishing apparatus may be operated independently from the viewpoints of the processing capabilities, the installation spaces, or the like of the apparatuses.

The present invention also provides a substrate processing method comprising: blowing an inert gas onto a substrate surface having a surface metal film while keeping the substrate surface at a predetermined temperature; supplying an organic acid gas, together with the inert gas, to the substrate surface to remove a denatured layer formed in the substrate surface; and then carrying out chemical mechanical polishing of the metal film.

The substrate processing method makes it possible to remove a denatured layer from a substrate surface by using a smaller-sized apparatus, and to more uniformly remove a surface metal film by chemical mechanical polishing.

The denatured layer typically may be an oxide film.

According to the surface treatment apparatus of the present invention, contaminants on a substrate surface, such as an organic material and an oxide on a metal surface, can be removed from the substrate surface to clean the surface while blocking oxygen from the substrate surface without using a vacuum apparatus. This enables downsizing of the surface treatment apparatus and shortening of the treatment time. Furthermore, BTA remaining on the substrate surface can also be removed without resorting to plasma etching, thus without causing damage to a semiconductor device.

According to the substrate processing apparatus of the present invention, chemical mechanical polishing of a metal film on a substrate surface can be carried out immediately after removing a natural oxide film on the metal film with an organic acid gas using the surface treatment apparatus which can be small-sized.

DETAILED DESCRIPTION OF THE PREFERRED EMBODIMENTS

Preferred embodiments of the present invention will now be described with reference to the drawings.

In the following embodiments, nitrogen gas is used as an inert gas and formic acid gas is used as a cleaning gas. A carboxylic acid gas other than formic acid gas, such as acetic acid gas or propionic acid gas, or a reducing gas, such as hydrogen gas may also be used as a cleaning gas. An inert gas for use in the present invention is, of course, not limited to nitrogen gas.

Figure 2:
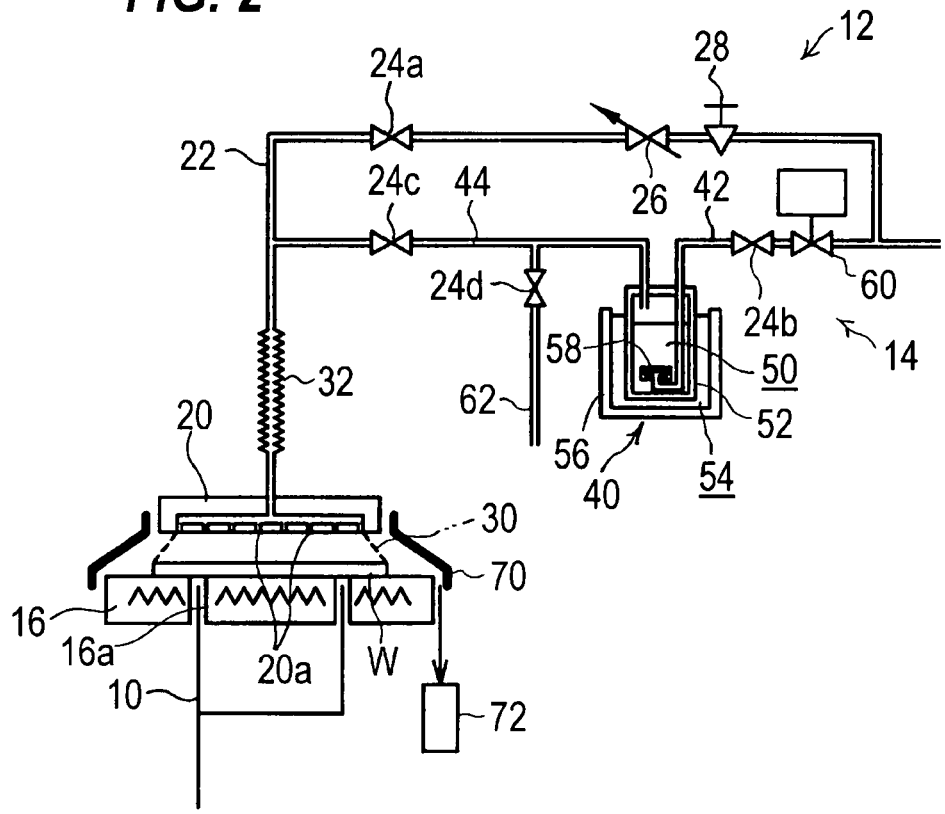
FIG. 2 is a schematic diagram illustrating a surface treatment apparatus according to an embodiment of the present invention during a cleaning treatment.
Figure 3:
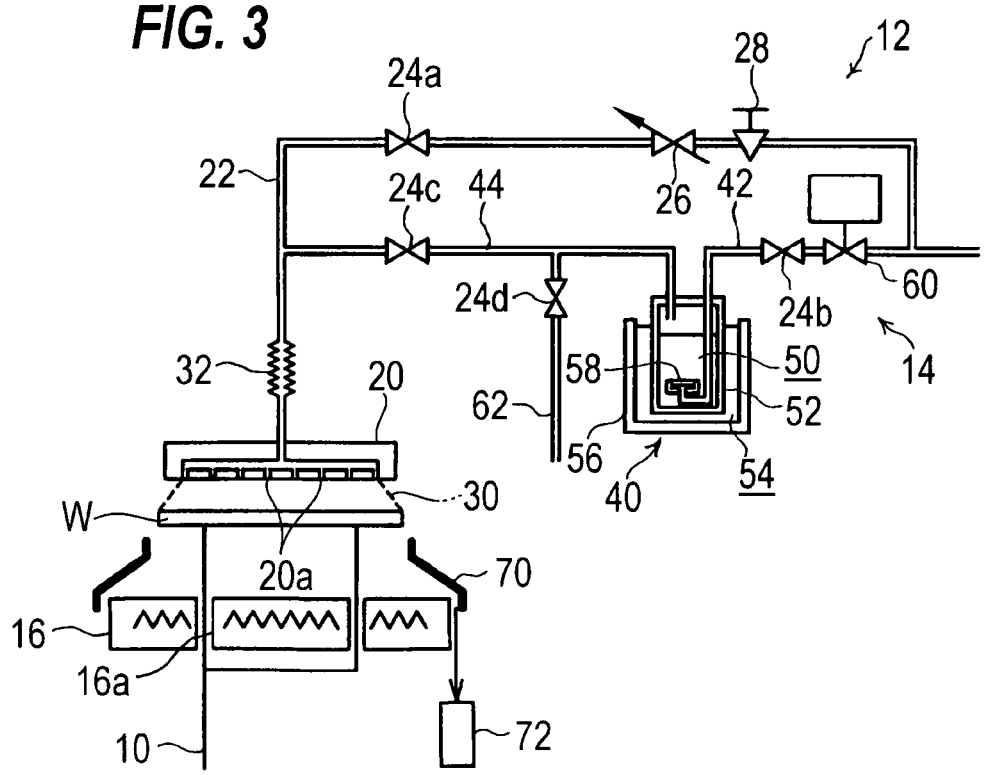
FIG. 3 is a schematic diagram illustrating the surface treatment apparatus according to an embodiment of the present invention before (or after) the cleaning treatment.

FIGS. 2 and 3 show a surface treatment apparatus according to an embodiment of the present invention, which is adapted to carry out cleaning of a surface of a substrate, such as a semiconductor wafer, in an oxygen-blocking condition over the entire substrate surface. As shown in FIGS. 2 and 3, the surface treatment apparatus includes a vertically-movable lifter 10 for holding thereon a substrate W with its front surface facing upwardly, an inert gas supply section 12 for supplying nitrogen gas (inert gas) to the surface (upper surface) of the substrate W held on the lifter 10, a cleaning gas supply section 14 for supplying a cleaning gas, which, in this embodiment, is a mixed gas of formic acid gas (cleaning gas) and nitrogen gas, to the surface (upper surface) of the substrate W held on the lifter 10, and a heating section 16 for heating the substrate W and keeping it at a predetermined temperature when the substrate W is placed on an upper surface of the heating section 16.

In this embodiment, the lifter 10 extends vertically through vertical through-holes 16a formed in the heating section 16, and also functions as a cooling section to naturally cool the substrate W when the lifter 10, holding the substrate W thereon, is raised so as to move the substrate W away from the heating section 16.

The inert gas supply section 12 is disposed above the lifter 10, and includes a disk-shaped shower head 20 having in its lower surface a large number of jet orifices 20a for jetting nitrogen gas (inert gas) toward the surface (upper surface) of the substrate W held on the lifter 10, and an inert gas pipe 22 for supplying nitrogen gas to the shower head 20. In the inert gas pipe 22 are provided, in the upstream order, an on-off valve 24a, a flow rate control valve 26 for controlling the flow rate of nitrogen gas flowing in the inert gas pipe 22, and a pressure reducing valve 28 for controlling the pressure of nitrogen gas supplied to the flow rate control valve 26.

The inert gas supply section 12 is designed to jet nitrogen gas from the jet orifices 20a of the shower head 20 toward the surface (upper surface) of the substrate W held on the lifter 10, thereby forming an oxygen-blocking zone 30, which blocks oxygen with nitrogen gas, between the surface of the substrate W and the shower head 20 such that the zone 30 covers the entire substrate surface. The shower head 20 is designed to be vertically movable, and the inert gas pipe 22 is provided with an accordion portion 32 which is contractible and extendable to enable a vertical movement of the shower head 20.

The cleaning gas supply section 14 includes a bubbler 40, a bubbler pipe 42 that branches from the inert gas pipe 22 of the inert gas supply section 12 at a junction upstream of the pressure reducing valve 28, and a cleaning gas pipe 44 that joins the inert gas pipe 22 of the inert gas supply section 12 at a junction between the on-off valve 24a and the accordion portion 32. By thus using a common nitrogen gas supply source for both of the inert gas supply section 12 and the cleaning gas supply section 14, the construction can be simplified. Further, the use of the common shower head 20 makes it possible to jet formic acid gas from the jet orifices 20a of the shower head 20 to the oxygen-blocking zone 30 formed between the surface of the substrate W and the shower head 20 by jetting inert gas from the jet orifices 20a of the shower head 20 toward the substrate W.

The bubbler 40 includes a closed vessel 52 for storing therein a formic acid solution 50, and a hot bath 56 for heating the formic acid solution 50 in the vessel 52 to a predetermined temperature by water 54. A porous plate 58 is disposed in the vessel 52 at a position where it is immersed in the formic acid solution 50, and the bubbler pipe 42 is connected to the porous plate 58. The cleaning gas pipe 44 extends from the upper space in the vessel 52 to the outside. By introducing nitrogen gas through the porous plate 58 into the formic acid solution 50 to bubble the solution, a mixed gas of nitrogen gas and formic acid gas is generated in the upper space in the vessel 52, and the mixed gas is introduced into the cleaning gas pipe 44.

The bubbler pipe 42 is provided with an on-off valve 24b and a flow rate control valve 60 for controlling the flow rate of nitrogen gas flowing in the bubbler pipe 42. The cleaning gas pipe 44 is provided with an on-off valve 24c, and a bypass pipe 62, having an on-off valve 24d, branches from the cleaning gas pipe 44 at a junction upstream of the on-off valve 24c. Thus, by opening the on-off valve 24b of the bubbler pipe 42, a mixed gas of nitrogen gas and formic acid gas is generated in the upper space in the vessel 52, and the mixed gas is allowed to flow through the bypass pipe 62 by closing the on-off valve 24c of the cleaning gas pipe 44 and opening the on-off valve 24d of the bypass pipe 62. By opening the on-off valve 24c of the cleaning gas pipe 44 and closing the on-off valve 24d of the bypass pipe 62, the mixed gas is allowed to flow through the cleaning gas pipe 44 and is jetted from the jet orifices 20a of the shower head 20.

In this embodiment, the heating section 16 is comprised of a hot plate having an internal heat source, and the substrate W can be heated by placing it on the heating section (hot plate) 16.

Instead of using a hot plate, it is also possible to heat the substrate W by means of infrared heating or by blowing of a hot gas, such as nitrogen gas.

The surface treatment apparatus of this embodiment is also provided with a generally-cylindrical (i.e., no top or bottom wall, as shown in FIG. 2) gas flow regulating mechanism 70 which extends upwardly from a position surrounding an upper portion of the heating section 16 and which, when the substrate W is placed on the heating section 16 and formic acid gas (mixed with nitrogen gas) is supplied to the oxygen-blocking zone 30, surrounds the circumference of the oxygen-blocking zone 30 and regulates the flow of formic acid gas in the oxygen-blocking zone 30. The gas flow regulating mechanism 70 Communicates with a gas discharge section 72, so that the formic acid gas can be prevented from flowing out of the apparatus.

A description will now be made of a surface treatment (cleaning) of a substrate by this surface treatment apparatus.

First, when the lifter 10 and the shower head 20 are in raised positions as shown in FIG. 3, the substrate W with its front surface facing upwardly is transported, e.g., by a transport apparatus to above the lifter 10 and is placed and held on the lifter 10. The temperature of the heating section 16 has been raised to a predetermined temperature. The on-off valve 24b of the bubbler pipe 42 is open to generate a mixed gas of nitrogen gas and formic acid gas in the upper space in the vessel 52 by bubbling of the formic acid solution 50 with nitrogen gas, and the mixed gas has been allowed to flow at a predetermine flow rate through the bypass pipe 62 by closing the on-off valve 24c of the cleaning gas pipe 44 and opening the on-off valve 24d of the bypass pipe 62. The on-off valve 24a of the inert gas supply section 12 has been closed.

After the substrate W is held on the lifter 10, the on-off valve 24a of the inert gas supply section 12 is opened to jet nitrogen gas from the jet orifices 20a of the shower head 20 toward the surface (upper surface) of the substrate W, thereby creating an oxygen-blocking zone 30, which blocks oxygen with nitrogen gas and in which substantially no oxygen exists, between the substrate W and the shower head 20. To create such an oxygen-blocking zone, the number and the arrangement of the jet orifices 20a, the distance between the shower head 20 and the substrate W, and the flow rate of the jetting nitrogen gas should be appropriately selected.

While continuing the formation of the oxygen-blocking zone 30 between the substrate W and the shower head 20 by jetting nitrogen gas from the jet orifices 20a of the shower head 20 toward the surface (upper surface) of the substrate W, the lifter 10 and the shower head 20 are lowered simultaneously. The lowering of the shower head 20 is stopped when the substrate W has come into contact with the heating section 16, whereas the lifter 10 is further lowered to separate the lifter 10 from the substrate W and place it on the heating section 16, as shown in FIG. 2. The substrate W is heated to a predetermined temperature by keeping it on the heating section 16 for a certain length of time while continuing the formation of the oxygen-blocking zone 30 between the substrate W and the shower head 20.

When the temperature of the substrate W has reached the predetermined temperature, the on-off valve 24c of the cleaning gas pipe 44 is opened and the on-off valve 24d of the bypass pipe 62 is closed to pass the mixed gas of formic acid gas and nitrogen gas through the cleaning gas pipe 44 and jet the mixed gas from the jet orifices 20a of the shower head 20, thereby cleaning the surface of the substrate W with formic acid gas. Thus, while continuously jetting nitrogen gas from the jet orifices 20a of the shower head 20 toward the surface (upper surface) of the substrate W to keep the formation of the oxygen-blocking zone 30 between the substrate W and the shower head 20, the mixed gas of formic acid gas and nitrogen gas is jetted from the jet orifices 20a of the same shower head 20 toward the surface (upper surface) of the substrate W to supply formic acid gas to the oxygen-blocking zone 30, thereby cleaning off an oxide film or an organic material on the substrate W.

When formic acid gas (mixed with nitrogen gas) is continuously supplied to the oxygen-blocking zone 30, the circumference of the oxygen-blocking zone 30 is surrounded by the gas flow regulating mechanism 70 to regulate the flow of formic acid gas in the oxygen-blocking zone 30, and the formic acid gas in the gas flow regulating mechanism 70 is discharged from the gas discharge section 72, thereby preventing formic acid gas from flowing out of the apparatus.

After carrying out cleaning of the surface of the substrate W with formic acid gas for a predetermined time, the on-off valve 24c of the cleaning gas pipe 44 is closed and the on-off valve 24d of the bypass pipe 62 is opened to stop the supply of formic acid gas, thereby terminating the cleaning treatment of the surface of the substrate W with formic acid gas.

The surface of the substrate W is generally more active after the cleaning treatment than before the cleaning treatment, and the cleaned surface can therefore be re-oxidized at the same level of the flow rate of nitrogen gas, forming the oxygen-blocking zone, as before the cleaning treatment. The oxygen-blocking performance of the zone can be enhanced so as to prevent re-oxidation of the substrate surface, for example, by increasing the flow rate of nitrogen gas, jetted from the jet orifices 20a of the shower head 20 toward the substrate W, after the cleaning treatment or by shortening the distance between the shower head 20 and the substrate W.

While thus keeping the surface of the substrate in a re-oxidation preventive atmosphere, the lifter 10 and the shower head 20 are raised simultaneously to hold the substrate W on the lifter 10 and separate the substrate W, held on the lifter 10, from the heating section 16, as shown in FIG. 3, thereby naturally cooling the substrate W, e.g., to a temperature of not more than 50° C.

The substrate W after cooling is transferred from the lifter 10 to a not-shown transport means and transported for the next process, whereby the surface treatment process is completed.

Figure 4:
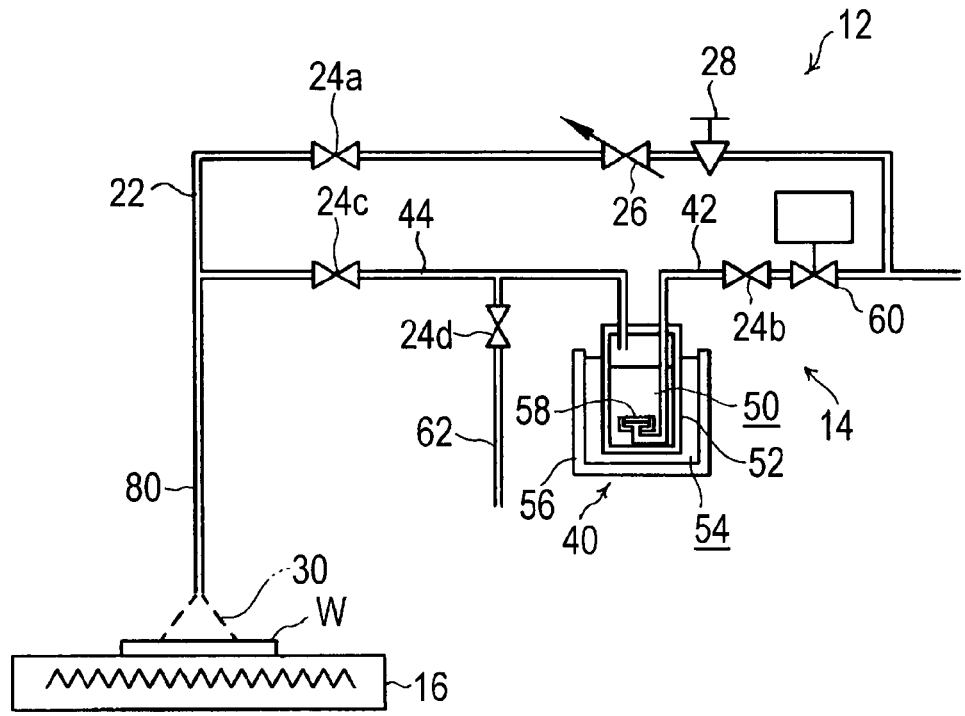
FIG. 4 is a schematic diagram illustrating an experimental apparatus for demonstrating the effectiveness of the surface treatment apparatus shown in FIGS. 2 and 3 and a surface treatment method using the surface treatment apparatus.

In order to demonstrate the effectiveness of the surface treatment apparatus shown in FIGS. 2 and 3 and the above-described surface treatment method using the surface treatment apparatus, an experiment was carried out using an experimental apparatus as shown in FIG. 4. The experimental apparatus shown in FIG. 4 differs from the surface treatment apparatus shown in FIGS. 2 and 3 in that the former is designed to jet a gas toward a substrate W from a fixed SUS pipe 80 and is not provided with the lifter 10 (therefore the heating section 16 has no through-hole 16a). In the apparatus shown in FIG. 4, members or elements, which are the same as or equivalent to those of the apparatus shown in FIGS. 2 and 3, are given the same reference numerals and a duplicate description thereof will be omitted.

The main experimental conditions are as follows.

| | |
|---|---|
| Type of substrate: | silicon wafer with surface copper plating |
| Removal object: | organic material (benzotriazole (BTA)) |
| Size of substrate: | 1 × 5 cm |
| Heater: | hot plate |
| Gas jet orifice: | SUS pipe, inner diameter 4.35 mm |
| Flow rate of formic acid gas: | 180 sccm (standard cc/min) |

BTA powder was dissolved in pure water to prepare a solution having a BTA concentration of 0.05 mol/L. A substrate was immersed in the solution for 30 seconds, followed by cleaning of the substrate with pure water for one minute and drying of the substrate, thereby applying BTA to a surface of the substrate.

Figure 5:
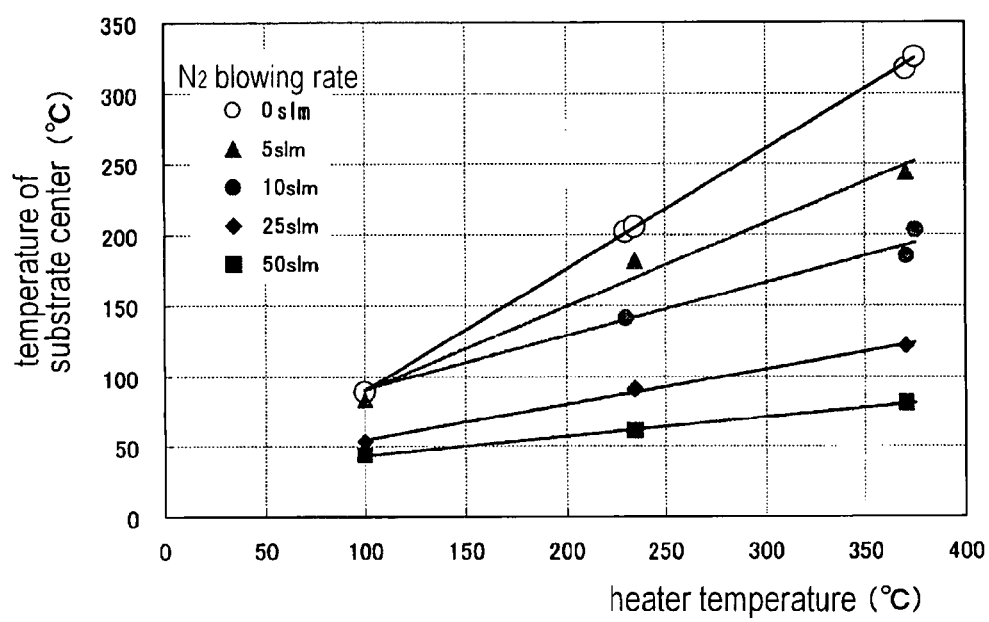
FIG. 5 is a graph showing the relationship between heater temperature, gas flow rate and substrate temperature.

In advance of experimental surface treatment of the substrate, the temperature of the substrate W was measured at varying surface temperatures of the heating section (heater) 16 and varying flow rates of nitrogen gas ($N_2$ blowing rate) jetted toward the surface of the substrate W. The results are shown in FIG. 5. In FIG. 5, the abscissa represents the heater temperature (° C.) and the ordinate represents the temperature of the center of the substrate (° C.), with the flow rate of nitrogen gas being a variable. The data in FIG. 5 shows that the substrate temperature decreases with an increase in the flow rate of nitrogen gas even at the same heater temperature, and that, when the flow rate of nitrogen gas is 10 slm (standard liter/min), for example, the heater temperatures of 230° C. and 375° are needed to make the substrate temperature 140° C. and 200° C., respectively.

Returning to FIG. 4, with the distance from the substrate W to the SUS pipe 80 fixed at 10 mm, the substrate W was heated to a predetermined temperature by the heating section (heater) 16 while jetting nitrogen gas from the lower end of the SUS pipe 80 toward the surface of the substrate W at a flow rate of 10 slm, and then a mixed gas of formic acid and nitrogen gas was jetted from the lower end of the SUS pipe 80 toward the surface of the substrate W. After the surface treatment, the removal of BTA from the substrate was estimated with the substrate temperature, the treatment time and the flow rate of formic acid gas as variables.

In particular, the experiment was carried out in the following manner.

Using the data of FIG. 5, the temperature of the heating section 16 of the experimental apparatus shown in FIG. 4 was raised to a temperature corresponding to an intended substrate temperature while passing nitrogen gas through the inert gas pipe 22 and jetting the gas from the SUS pipe 80 at a flow rate of 10 slm.

The hot bath 56 was set at a predetermined temperature to keep the water 54 in the hot bath, e.g., at 62° C. and keep the formic acid solution 50 in the vessel 52 at approximately the same temperature as the water 54 while nitrogen gas, whose flow rate was controlled by the flow rate control valve 60, was allowed to pass the on-off valve 24b of the bubbler pipe 42 and flow through the porous plate 58 into the formic acid solution 50, thereby bubbling the formic acid solution 50 and generating a mixed gas of nitrogen gas and formic acid gas. Before commencement of substrate surface treatment, the mixed gas was kept in a steady state by allowing it to flow through the bypass pipe 62.

Cleaning treatment of the surface of the substrate W was carried out in the following manner:

The substrate W was grasped with tweezers and positioned right under the SUS pipe 80. While jetting nitrogen gas from the SUS pipe 80 toward the substrate W, the substrate was placed on the heating section 16 and the tweezers were detached, and the substrate W was heated for two minutes to a predetermined temperature. While continuing jetting of nitrogen gas from the SUS pipe 80 toward the substrate W, the on-off valve 24d of the bypass pipe 62 was closed and the on-off valve 24c of the cleaning gas pipe 44 was opened to pass the mixed gas of formic acid gas and nitrogen gas through the cleaning gas pipe 44 and jet the mixed gas from the SUS pipe 80 toward the surface of the substrate W. In accordance with experimental conditions, treatment times were varied from 0.1 minute to 10 minutes.

After an elapse of the treatment time, the flow rate of nitrogen gas jetted from the SUS pipe 80 was increased from 10 slm to 50 slm in order to enhance the oxygen-blocking performance of the nitrogen gas atmosphere over the substrate surface. The substrate W was then grasped with tweezers and lifted from the heating section 16 by about 5 mm. Thereafter, the on-off valve 24c of the cleaning gas pipe 44 was closed to stop the supply of formic acid gas, and the substrate W was cooled to about 50° C. or lower. After the cooling, the substrate W was taken out from right under the SUS pipe 80, thereby completing the surface treatment process.

Figure 1:
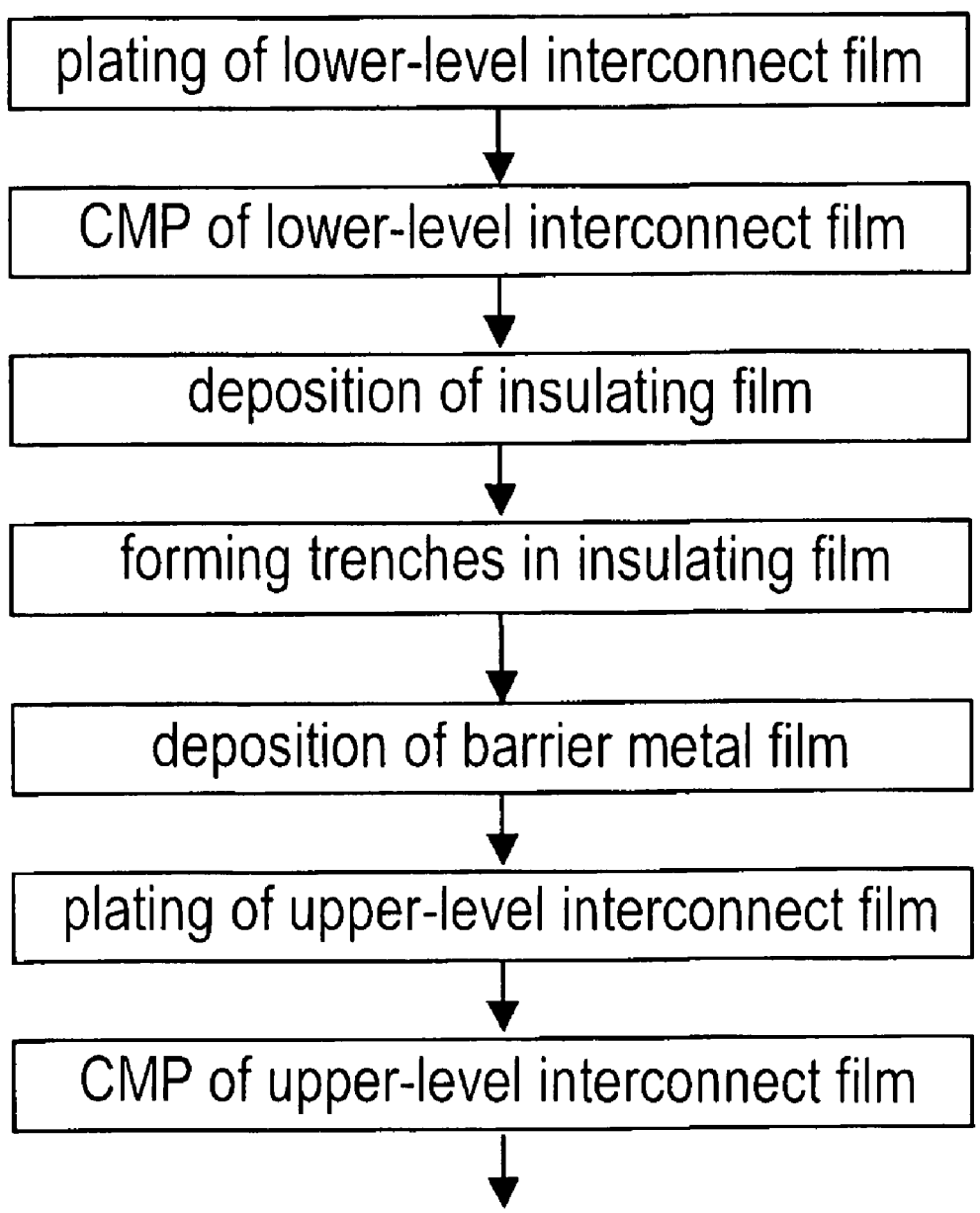
FIG. 1 is a flow chart of a conventional process for the manufacturing of a semiconductor device.

The results of the experiment are shown in FIG. 1.

TABLE 1

|  |  | Substrate temp. | | | |
| --- | --- | --- | --- | --- | --- |
|  |  | 120° C. | 140° C. | 175° C. | 200° C. |
| Treatment time | 10 min | (◯) | (◯) | (◯) | (◯) |
|  | 4 min | (◯) | (◯) | (◯) | (◯) |
|  | 2 min | ◯ | ◯ | (◯) | (◯) |
|  | 1 min | Δ | (◯) | (◯) | (◯) |
|  | 0.5 min |  | ◯ | (◯) | ◯ |

Referring to Table 1, the removal of BTA from the substrate surface was estimated by measuring with an ellipsometer the substrate surface before and after the treatment. The phase angle Δ of an elliptical polarization measured with an ellipsometer (hereinafter referred to simply as phase angle Δ), which is an index of the surface state of a substrate, is not more than −109° C. when the substrate surface is sufficiently clean. The phase angle Δ of the substrate used in the experiment was around −106° C. before the cleaning treatment. Accordingly, BTA was determined to have been completely removed from the substrate surface when the phase angle Δ after the treatment was not more than −109° C., and in this case Table 1 is marked with "◯". When the phase angle Δ after the treatment was more than −109° C., the removal of BTA from the substrate surface was determined to be insufficient, and in this case Table 1 is marked with "Δ". The mark "(◯)" in table 1 indicates that the complete removal of BTA (mark "◯") is inferable for the treatment conditions from the measured "◯" data.

The data in table 1 shows the following facts:

(1) BTA can be removed at the minimum substrate temperature of 120° C. if the treatment is carried out for at least 2 minutes.

(2) BTA can be removed with the minimum treatment time of 0.5 minute if the substrate temperature is at least 140° C.

As with BTA, a natural oxide film on a copper interconnect film was found to be removable under conditions similar to those for BTA.

In the above experiment, BTA and a natural oxide film were removed in an approximately 10 mm-diameter circular area of the substrate surface. It is obvious that an oxygen-blocking zone can be formed over an entire surface of a substrate having a diameter of 200 mm or 300 mm and the entire substrate surface can be effectively cleaned by appropriately selecting the number and arrangement of jet orifices, the distance between the jet orifices and the substrate, and the flow rate of gas jetted from the jet orifices.

Figure 6:
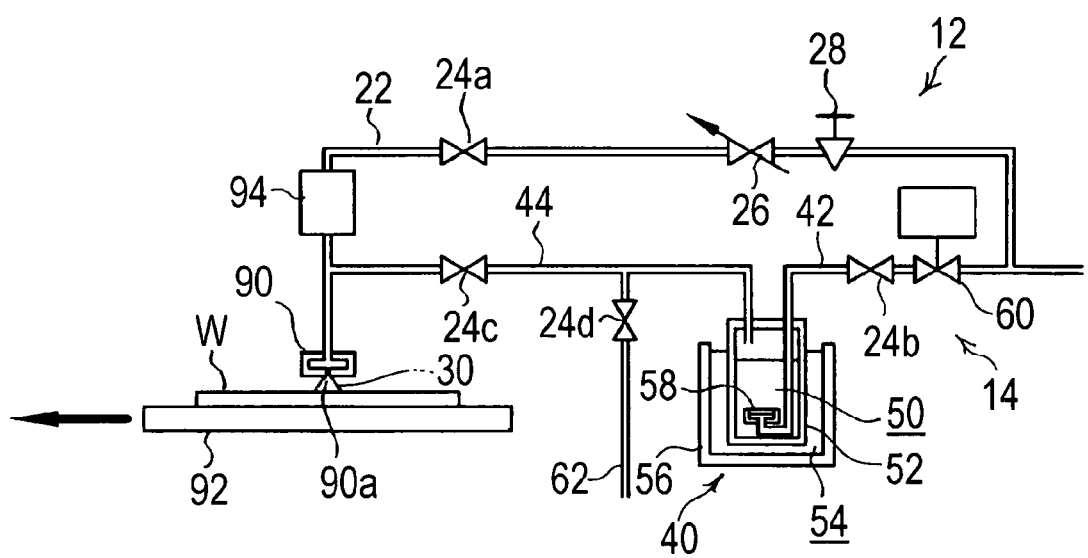
FIG. 6 is a schematic diagram illustrating a surface treatment apparatus according to another embodiment of the present invention during a cleaning treatment.

FIG. 6 shows a surface treatment apparatus according to another embodiment of the present invention. The surface treatment apparatus shown in FIG. 6 differs from the surface treatment apparatus shown in FIGS. 2 and 3 in the following respects. In the surface treatment apparatus shown in FIG. 6, members or elements, which are the same as or equivalent to those of the apparatus shown in FIGS. 2 and 3, are given the same reference numerals and a duplicate description thereof will be omitted. The same holds for later-described embodiments.

Instead of the shower head 20 of the surface treatment apparatus shown in FIGS. 2 and 3, the surface treatment apparatus shown in FIG. 6 uses, at the lower end of the inert gas pipe 22, a gas jet head 90 which is not vertically movable and has a linear or zonal slit 90a having a length which is not less than the diameter of a substrate W. The apparatus of this embodiment also includes a substrate holder 92 which is movable in a direction perpendicular to the slit 90a of the gas jet head 90 and holds the substrate W on its upper surface, and a heating section 94, provided in the inert gas pipe 22, for heating nitrogen gas flowing along the pipe 22 so as to heat the substrate W with the heated nitrogen gas jetted toward the substrate W.

According to this embodiment, an oxygen-blocking zone 30 can be formed between part of the surface of the substrate W and the gas jet head 90 with nitrogen gas jetted from the slit 90a of the gas jet head 90 toward the substrate W and, at the same time, cleaning of the part of the surface of the substrate W can be carried out by jetting a mixed gas of formic acid gas and nitrogen gas from the slit 90a of the gas jet head 90 toward the substrate W in the oxygen-blocking zone 30 while keeping the surface of the substrate W at a predetermined temperature by heating the substrate surface. The cleaning treatment can be carried out over the entire substrate surface by moving the substrate holder 92 during the treatment.

This embodiment enables the use of a further simplified surface treatment apparatus. Unlike the preceding embodiment, jetting of nitrogen gas toward the substrate W upon cooling of the substrate is not carried out in this embodiment after the cleaning treatment of the substrate surface. Thus, this embodiment is particularly useful for a substrate which is little affected by re-oxidation of the substrate surface.

Figure 7:
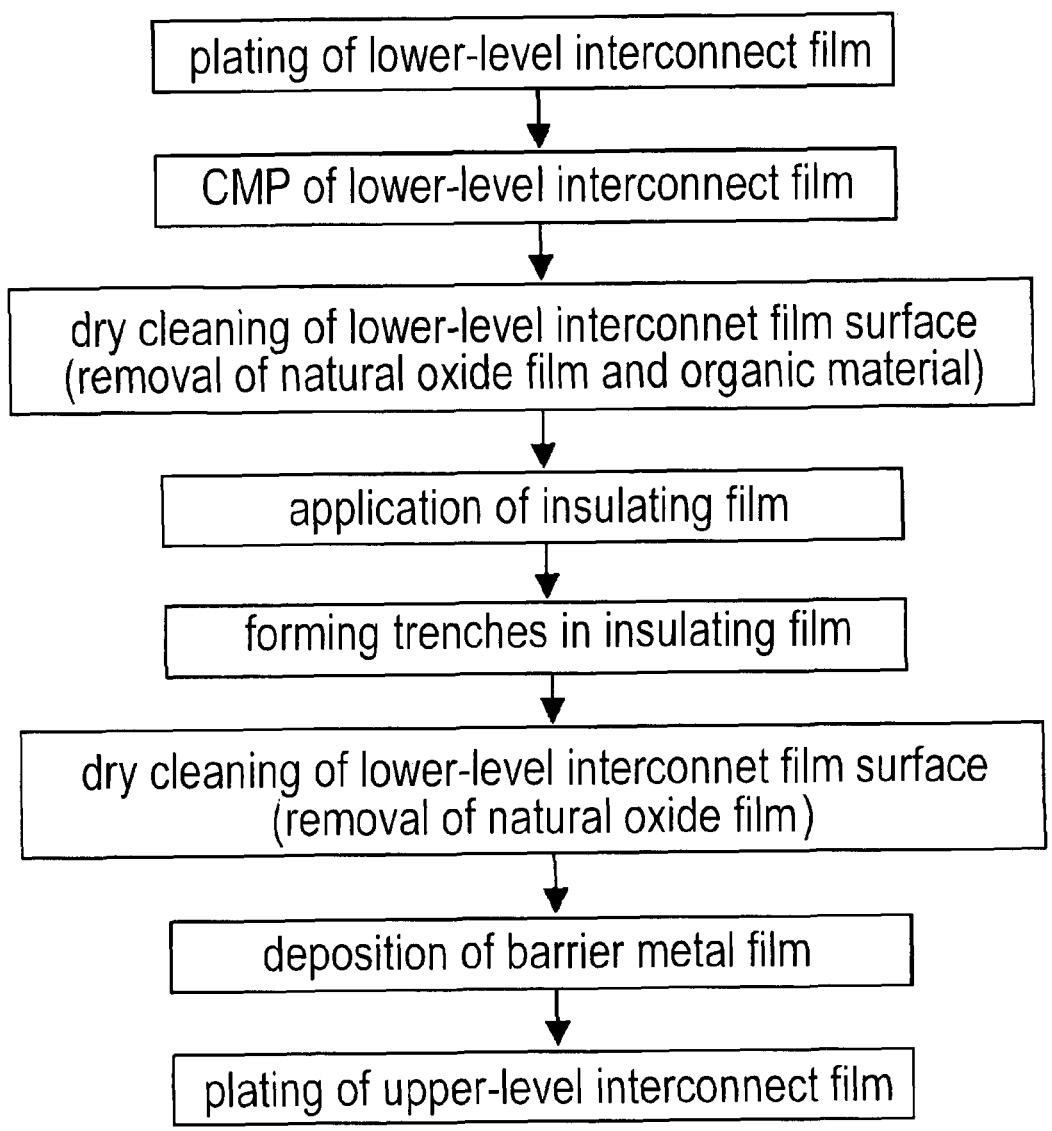
FIG. 7 is a flow chart of a process for the manufacturing of a semiconductor device, to which process is applied a surface treatment method according to the present invention.

A process for manufacturing a semiconductor device having a multi-level interconnect structure by using any one of the surface treatment apparatuses of the above-described embodiments will now be described with reference to FIG. 7. As with the conventional process shown in FIG. 1, a lower-level interconnect film of, e.g., copper is formed by plating on a substrate, and a surface of the lower-level interconnect film is polished and flattened by CMP to form lower-level interconnects. When the lower-level interconnects are thus formed, before forming an insulating film on the surface of the substrate, a natural oxide film can form on the surfaces of the lower-level interconnects, and benzotriazole (BTA) used in CMP to prevent corrosion of copper as an interconnect material, can remain on the substrate surface. The natural oxide film and BTA both have an inhibitory influence on the electrical connection between upper-level interconnects and the lower-level interconnects.

When exposing part of the lower-level interconnects upon the formation of trenches and holes for connection with upper-level interconnects in the insulating film, a natural oxide film, which has an inhibitory influence on the electrical connection between upper-level interconnects and the lower-level interconnects, can form in the exposed surface of the lower-level interconnects.

In this embodiment, therefore, surface treatment of the substrate having the lower-level interconnects formed in the surface, i.e., dry cleaning of the substrate surface, is carried out by using the surface treatment apparatus shown in FIGS. 2 and 3 or the surface treatment apparatus shown in FIG. 6 to remove a natural oxide film formed on the surfaces of the lower-level interconnects and/or benzotriazole (BTA) remaining on the substrate surface.

Thereafter, an insulating film is formed over the surface of the substrate, and trenches are formed in the insulating film, and then a barrier metal film is formed over the surface of the substrate. Thereafter, an upper-level interconnect film of, e.g., copper is formed by plating on a surface of the barrier metal film, followed by CMP to polish and flatten a surface of the upper-level interconnect film, thereby forming upper-level interconnects.

Alternatively, after forming the trenches in the insulating film, dry cleaning of the exposed surfaces of the underlying lower-level interconnects is carried out to remove a natural oxide film formed on the surfaces of the lower-level interconnects. Thereafter, a barrier metal film is formed over the substrate surface, and then an upper-level interconnect film of, e.g., copper is formed by plating on a surface of the barrier metal film, followed by CMP to polish and flatten a surface of the upper-level interconnect film, thereby forming upper-level interconnects.

It is possible to carry out only one of the above two dry cleaning treatments, according to necessity.

According to the above process, a natural oxide film formed on the surfaces of the lower-level interconnects and benzotriazole (BTA) remaining on the surface of the substrate can be removed to ensure good electrical connection between the upper-level interconnects and the lower-level interconnects, without carrying out a surface treatment of the substrate by means of plasma cleaning, thus without causing damage to a semiconductor device.

The substrate surface may be composed of an insulating material and/or a metal or a metal compound, such as copper, tantalum or a tantalum nitride, titanium or titanium nitride, tungsten or tungsten nitride, or ruthenium.

Figure 8:
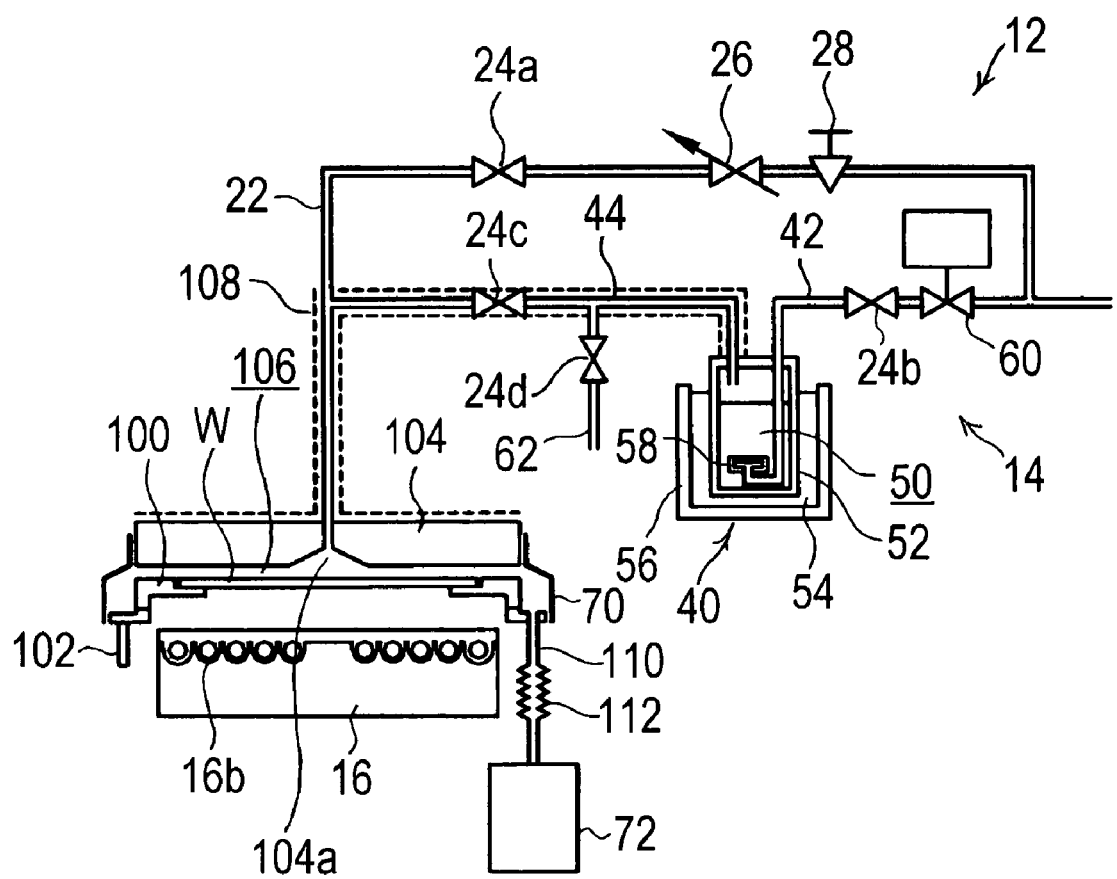
FIG. 8 is a schematic diagram illustrating a surface treatment apparatus according to yet another embodiment of the present invention before (or after) a cleaning treatment.
Figure 9:
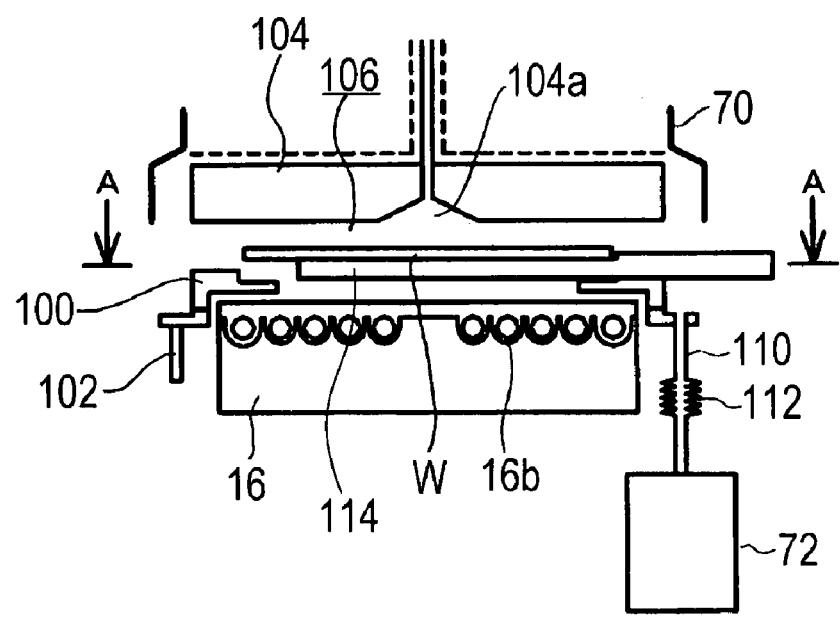
FIG. 9 is an enlarged view of the main portion of the apparatus of FIG. 8.
Figure 10:
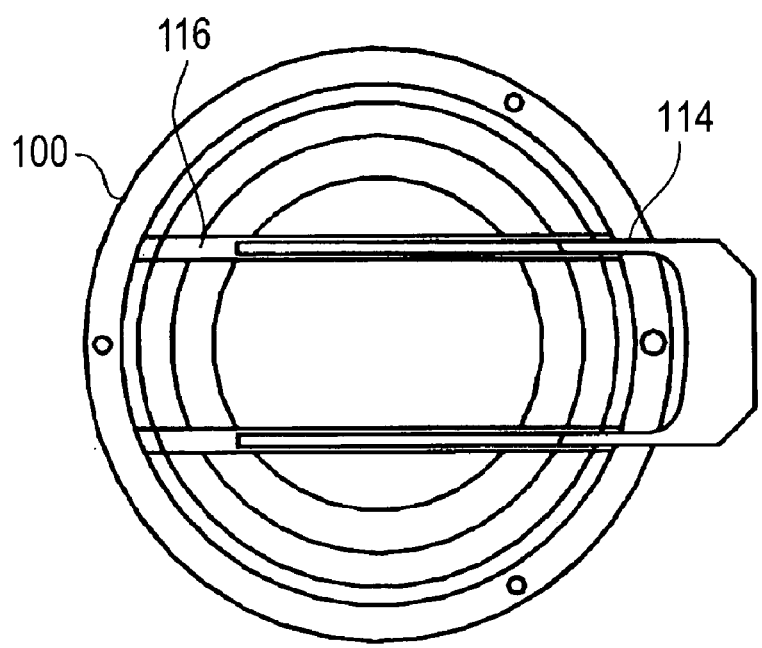
FIG. 10 shows the main portion of the apparatus of FIG. 8 as viewed in the direction of the arrow A-A shown in FIG. 9.

FIGS. 8 through 10 show a surface treatment apparatus according to yet another embodiment of the present invention. The surface treatment apparatus shown in FIGS. 8 through 10 differs from the surface treatment apparatus shown in FIGS. 2 and 3 in the following respects.

Instead of the lifter 10 used in the embodiment shown in FIGS. 2 and 3, the surface treatment apparatus of this embodiment includes a ring-shaped holder 100, disposed above the heating section 16, for holding a substrate W by supporting a peripheral portion thereof. The holder 100 is coupled to the upper end of a vertically-movable lifting shaft 102 disposed beside the heating section 16, and thus is vertically movable. The surface treatment apparatus of this embodiment also includes a disk-shaped fixed head 104 centrally having a jet orifice 104a whose diameter increases in the downward direction. The holder 100 shown in FIG. 8 is in the highest position where the distance between the head 104 and the substrate W held on the holder 100 is, for example, 0.6 mm. Because the position of the head 104 is fixed in this embodiment, the inert gas pipe 22 is not provided with the accordion portion 32.

The surface treatment apparatus is designed to jet nitrogen gas (inert gas) from the jet orifice 104a of the head 104 toward the surface (upper surface) of the substrate W held on the holder 100, thereby forming an oxygen-blocking zone 106, which blocks oxygen with nitrogen gas, between the surface of the substrate W and the head 104 such that the zone 106 covers the entire substrate surface.

The use of the head 104 and the holder 100, both having a larger diameter, can securely form an oxygen-blocking zone 106 that covers the entire surface, including the periphery, of the substrate W while maintaining an appropriate distance between the head 104 and the holder 100.

The cleaning gas pipe 44, the inert gas pipe 22 on the downstream side of the junction with the cleaning gas pipe 44, and the head 104 are provided with a pipe heater 108 for heating them to a temperature higher than the temperature of the formic acid solution 50 in the hot bath 56. Thus, the temperature of formic acid gas, generated in the bubbler 40, gradually increases as it flows toward the substrate W. This can prevent dew condensation of formic acid gas on the surfaces of apparatus components before the gas reaching the substrate W.

In this embodiment, the heating section 16 has in its interior a lamp heater 16b, so that the substrate W, held on the holder 100 and located above the heater 16, can be heated by radiant heat from the lamp heater 16b. Instead of using a lamp heater, it is also possible to heat the substrate W by blowing of a hot gas, such as nitrogen gas.

The surface treatment apparatus of this embodiment is also provided with a generally-cylindrical gas flow regulating mechanism 70 which extends upwardly from a position surrounding an upper portion of the heating section 16 and which, when the substrate W is placed on the holder 100 and formic acid gas (mixed with nitrogen gas) is supplied to the oxygen-blocking zone 106, surrounds the circumference of the oxygen-blocking zone 106 and regulates the flow of formic acid gas in the oxygen-blocking zone 106. The gas flow regulating mechanism 70, the head 104, the holder 100 and the substrate W define an enclosed space which communicates with a gas discharge section 72 via a regulating pipe 110, so that the formic acid gas supplied into the oxygen-blocking zone 106 can be prevented from flowing out of the apparatus. In this embodiment, the gas flow regulating mechanism 70 is designed to be vertically movable, and the regulating pipe 110 has an extendable portion 112 to enable a vertical movement of the holder 100.

As shown in FIG. 10, grooves 116, conforming to the shape of a fork 114 carrying the substrate W, are provided in the upper surface of the holder 100. When the holder 100 is in a lowered position, the fork 114 carrying the substrate W is moved along the grooves 116 and inserted between the holder 100 and the head 104, as shown in FIG. 9, and then the holder 100 is raised so as to support a peripheral portion of the substrate W and thereby hold the substrate W.

The operation of the surface treatment apparatus shown in FIGS. 8 to 10 will now be described.

First, the on-off valve 24b of the bubbler pipe 42 is opened to generate a mixed gas of nitrogen gas and formic acid gas in the upper space in the vessel 52 by bubbling of the formic acid solution 50 with nitrogen gas, and the mixed gas is allowed to flow at a predetermine flow rate through the bypass pipe 62 by closing the on-off valve 24c of the cleaning gas pipe 44 and opening the on-off valve 24d of the bypass pipe 62. The on-off valve 24a of the inert gas supply section 12 has been closed.

Next, when the gas flow regulating mechanism 70 is in a raised position and the holder 100 is in a lowered position, the fork 114 carrying the substrate W is inserted into the grooves 116 provided in the holder 100, as shown in FIG. 9. The fork 114 is, for example, the front end portion of the below-described second transfer robot 212 shown in FIG. 15. Thereafter, the holder 100 is raised to the position shown in FIG. 8, and the substrate W is separated from the fork 114 and the fork 114 is then retreated from the grooves 116. Subsequently, the gas flow regulating mechanism 70 is lowered to the position shown in FIG. 8.

Next, the on-off valve 24a of the inert gas supply section 12 is opened to jet nitrogen gas from the jet orifice 104a of the head 104 toward the surface (upper surface) of the substrate W, thereby creating an oxygen-blocking zone 106, which blocks oxygen with nitrogen gas and in which substantially no oxygen exists, between the substrate W and the head 104. The substrate W is heated to a predetermined temperature by turning on the lamp heater 16b of the heating section 16 at a given power while keeping the formation of the oxygen-blocking zone 106 between the substrate W and the head 104.

After heating the substrate W until the predetermined temperature is reached, the on-off valve 24c of the cleaning gas pipe 44 is opened and the on-off valve 24d of the bypass pipe 62 is closed to pass the mixed gas of formic acid gas and nitrogen gas through the cleaning gas pipe 44 and jet the mixed gas from the jet orifice 104a of the head 104, thereby cleaning the surface of the substrate W with formic acid gas. When formic acid gas (mixed with nitrogen gas) is continuously jetted and supplied to the oxygen-blocking zone 106, the jetted gas is discharged via the regulating pipe 110 to the gas discharge section 72, thereby preventing formic acid from flowing out of the apparatus.

After carrying out cleaning of the surface of the substrate W with formic acid gas for a predetermined time, the on-off valve 24c of the cleaning gas pipe 44 is closed and the on-off valve 24d of the bypass pipe 62 is opened to stop the supply of formic acid gas, thereby terminating the cleaning treatment of the surface of the substrate W with formic acid gas. The lamp heater 16b of the heating section 16 is then turned off to stop heating of the substrate.

The surface of the substrate W is generally more active after the organic acid treatment than before the organic acid treatment, and the treated surface can therefore be re-oxidized at the same level of the flow rate of nitrogen gas, forming the oxygen-blocking zone, as before the cleaning treatment. The flow rate of nitrogen gas, jetted from the jet orifice 104a of the head 104 toward the substrate W, is therefore increased after the cleaning treatment to enhance the oxygen-blocking performance of the zone, thereby preventing re-oxidation of the surface of the substrate W. The substrate W is kept in such a re-oxidation preventive atmosphere, thereby naturally cooling the substrate W, e.g., to a temperature of not more than 50° C.

In the surface treatment apparatus shown in FIGS. 8 through 10, a peripheral portion of the substrate W is supported on the upper surface of the inwardly-extending portion of the ring-shaped holder 100 when the substrate W is held on the holder 100. When the substrate W is thus held on the holder 100, the surface of the substrate W is approximately flush with the top surface of the holder 100 and the substrate W is circumferentially closed with the portion of the holder 100 which lies outside the substrate W.

Figure 11:
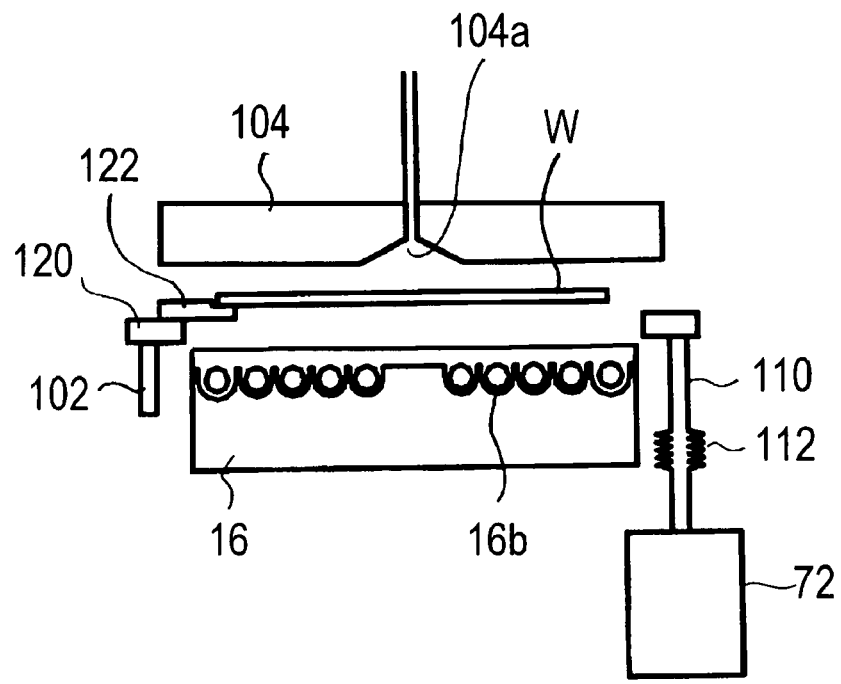
FIG. 11 is a diagram equivalent to FIG. 9, illustrating a variation of the surface treatment apparatus shown in FIG. 8.
Figure 12:
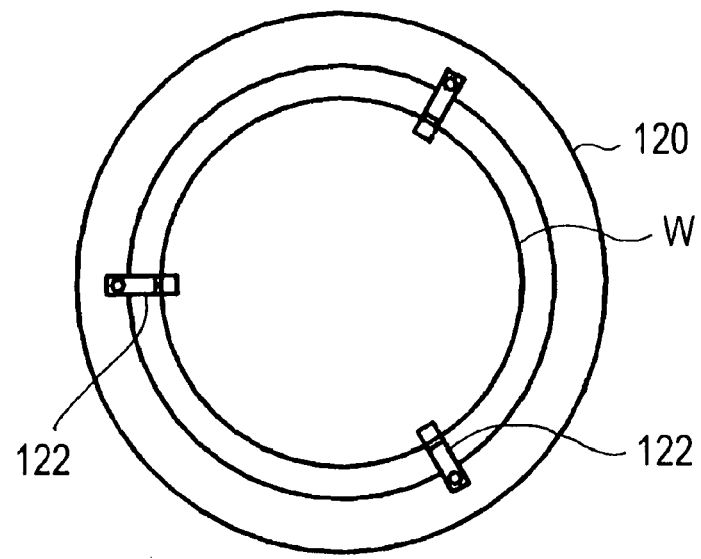
FIG. 12 is a plan view of a holder and claws used in the variation shown in FIG. 11.

FIGS. 11 and 12 show a variation of the surface treatment apparatus shown in FIGS. 8 through 10. In the surface treatment apparatus shown in FIGS. 11 and 12, a ring-shaped holder 120 is mounted on the upper end of the lifting shaft 102, and a plurality (e.g., three) of inwardly-extending claws 122 are mounted to the holder 120 at its predetermined positions along the circumferential direction of the holder 120. The claws 122 support peripheral portions of the lower surface of a substrate W. The inner diameter of the holder 120 is larger than the outer diameter of the substrate W. Thus, unlike the embodiment shown in FIGS. 8 through 10, the peripheral region of the lower surface of the substrate W is not covered or closed. The other construction is substantially the same as the surface treatment apparatus shown in FIGS. 8 through 10.

The following experiments were carried out in order to demonstrate the effectiveness of the surface treatment apparatus shown in FIGS. 8 through 10 (hereinafter referred to as "ring-type surface treatment apparatus"), the surface treatment apparatus shown in FIGS. 11 and 12 (hereinafter referred to as "claw-type surface treatment apparatus") and the above-described surface treatment methods using these surface treatment apparatuses.

The main experimental conditions are as follows:

| | |
|---|---|
| Type of substrate: | silicon wafer with surface copper plating |
| Removal object: | natural oxide film (thickness: about 5 nm) |
| Size of substrate: | 200 mm |
| Inert gas and flow rate: | nitrogen gas at 0.3-30 slm (standard liter/min) |
| Organic acid gas and flow rate: | formic acid gas at 30-300 sccm (standard cc/min) |
| Temperature of substrate: | 150-250° C. |
| Distance between head and substrate: | 0.6 mm |

The experimental results will now be described.

Figure 13:
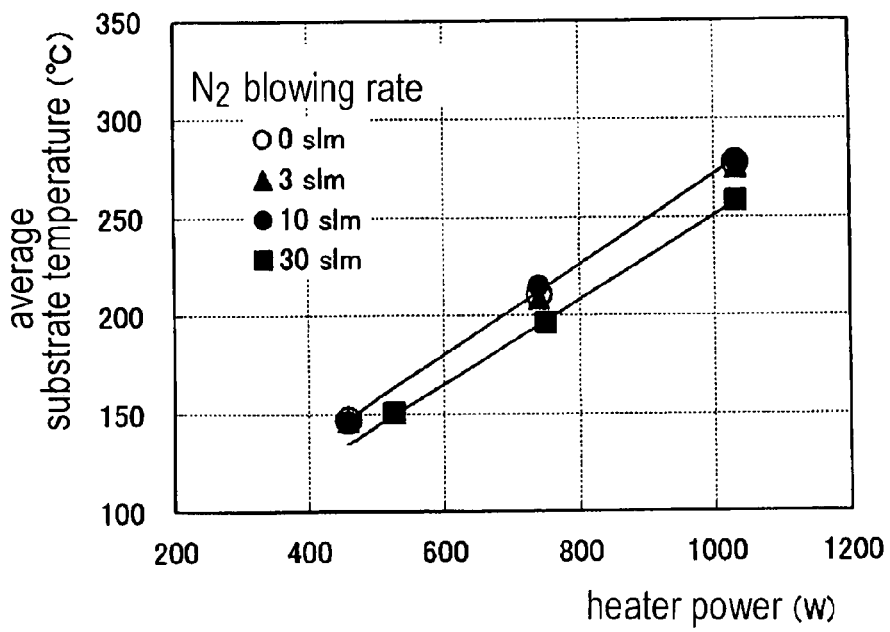
FIG. 13 is a graph showing the relationship of a heater power (W) supplied to a lamp heater and the average temperature (° C.) of a substrate to the flow rate of nitrogen gas ($N_2$ blowing rate) supplied between a head and the substrate in the surface treatment apparatus shown in FIGS. 11 and 12.

FIG. 13 shows the relationship of a heater power (W) supplied to the lamp heater 16b and the average temperature (° C.) of a substrate W to the flow rate of nitrogen gas ($N_2$ blowing rate) supplied between the head 104 and the substrate W in the claw-type surface treatment apparatus. The average substrate temperature was determined by averaging the temperatures measured at 5 points in the substrate whose distances from the center of the substrate were −92, −45, 0, 45 and 92 mm. As can be seen from the data in FIG. 13, there is substantially the same relationship between the substrate temperature and the heater power when the flow rate of nitrogen gas is in the range of 0-10 slm.

Figure 14:
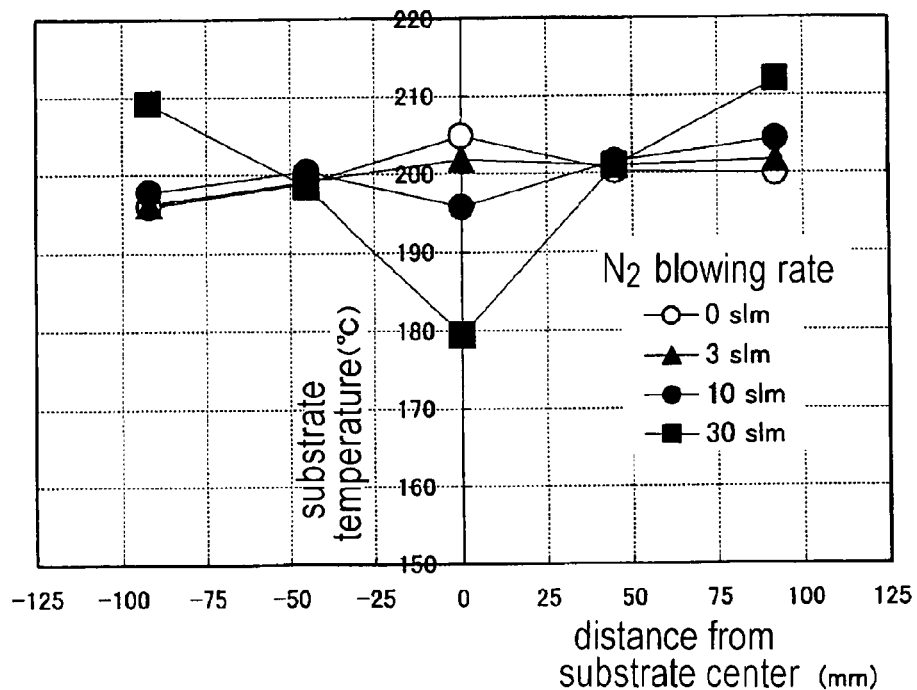
FIG. 14 is a graph showing a temperature distribution in the substrate of FIG. 13 when the substrate has an average temperature of 200° C.

FIG. 14 is a graph showing a temperature distribution in the substrate when the average substrate temperature, shown in FIG. 13, is 200° C. As shown by the data in FIG. 14, the deviation in the substrate temperature distribution is within the range of −4% to +4% when the flow rate of nitrogen gas is in the range of 0-10 slm.

Table 2 below shows the results of an experiment carried out to determine those treatment conditions which effectively prevent surface oxidation of a substrate W when the substrate is treated by heating it while supplying nitrogen gas between the head 104 and the substrate W in the claw-type surface treatment apparatus.

Oxidation of the surface of the substrate W progresses as it is heated when the flow rate of nitrogen gas supplied is small, i.e., when the oxygen concentration over the substrate surface is high. In this test the conditions of the flow rate of nitrogen gas supplied and the substrate temperature, which effectively prevent surface oxidation of the substrate, were investigated. The substrate was heated at the varying temperatures indicated in Table 2 for 15 minutes while supplying nitrogen gas at the varying flow rates indicated in Table 2. Before and after the respective treatments, the surface of the substrate was measured with an ellipsometer. The conditions of a treatment were determined to be oxidation preventive conditions when a change in the measured phase angle Δ toward oxidation after the treatment was not more than 2°, and in this case Table 2 is marked with "○".

TABLE 2

| Flow rate of $N_2$ gas | Substrate temp. 150° C. | 175° C. | 200° C. | 225° C. | 250° C. |
|---|---|---|---|---|---|
| 30 slm | (○) | (○) | (○) | (○) | (○) |
| 10 slm | (○) | (○) | ○ | ○ | ○ |
| 3 slm | (○) | ○ | Δ | | |

The mark "(○)" in table 2 indicates that prevention of surface oxidation of the substrate (mark "○") is inferable for the treatment conditions from the measured "○" data, and the mark "Δ" indicates that the treatment conditions do not satisfy the above-described requirement for oxidation preventive conditions. The data in Table 2 demonstrates that when the substrate temperature is 150° C. or 175° C., oxidation of the substrate surface can be prevented by supplying nitrogen gas between the head 104 and the substrate W at a flow rate of 3 slm or higher.

Table 3 shows the results of an experiment conducted to determine those conditions of the substrate temperature and the flow rate of nitrogen gas which are necessary for removing a natural oxide film from the substrate surface in a cleaning treatment of the substrate surface carried out by supplying formic acid gas at a flow rate of 100 sccm for 10 minutes using the claw-type surface treatment apparatus.

Table 4 shows the results of an experiment conducted to determine those conditions of the substrate temperature and the flow rate of nitrogen gas which are necessary for removing a natural oxide film from the substrate surface in a cleaning treatment of the substrate surface carried out by supplying formic acid gas at a flow rate of 100 sccm for 10 minutes using the ring-type surface treatment apparatus.

TABLE 3

| Flow rate of $N_2$ gas | Substrate temp. 150° C. | 175° C. | 200° C. | 225° C. | 250° C. |
|---|---|---|---|---|---|
| 30 slm | (◯) | (◯) | | Δ | |
| 10 slm | ◯ | ◯ | Δ | | |
| 3 slm | | Δ | Δ | | |
| 1 slm | | | | | |

TABLE 4

| Flow rate of $N_2$ gas | Substrate Temp. 150° C. | 175° C. | 200° C. | 225° C. | 250° C. |
|---|---|---|---|---|---|
| 30 slm | (◯) | (◯) | | | |
| 10 slm | ◯ | ◯ | Δ | | |
| 3 slm | | Δ | | | |
| 1 slm | | | | | |

Referring to Tables 3 and 4, the removal of an oxide film from the substrate surface was estimated by measuring with an ellipsometer the substrate surface before and after the cleaning treatment. An oxide film was determined to have been completely removed from the substrate surface when the measured phase angle Δ of elliptical polarization after the cleaning treatment was not more than −109° C., and in this case Tables 3 and 4 are marked with "◯". The phase angle Δ of the substrate before the cleaning treatment was about −100° C., and a natural oxide film having a thickness of about 5 nm was formed on the substrate before the treatment. When the phase angle Δ after the treatment was more than −109° C., the removal of oxide film from the substrate surface was determined to be insufficient, and in this case Table 3 and 4 are marked with "Δ". The mark "(◯)" in tables 3 and 4 indicates that the complete removal of oxide film (mark "◯") is inferable for the treatment conditions from the measured "◯" data. The data in tables 3 and 4 demonstrates that a natural oxide film can be removed by the cleaning treatment with formic acid gas under the conditions of the substrate temperature of 150° C. or 175° C. and the flow rate of nitrogen gas of not less than 10 slm in both the claw-type surface treatment apparatus and the ring-type surface treatment apparatus.

Table 5 shows the results of an experiment conducted to determine those conditions of the flow rate of formic acid gas and treatment time which are necessary to remove a natural oxide film from the substrate surface in a cleaning treatment of the substrate surface carried out under the conditions of the substrate temperature of 175° C. and the flow rate of nitrogen gas of 10 slm using the claw-type surface treatment apparatus. Measurement of the substrate surface with an ellipsometer was carried out in the same manner as in the preceding experiments.

TABLE 5

| | | Flow rate of formic acid gas | | |
|---|---|---|---|---|
| | | 30 sccm | 100 sccm | 300 sccm |
| Treatment time | 10 min | (◯) | ◯ | (◯) |
| | 3 min | Δ | (◯) | (◯) |
| | 1 min | | ◯ | (◯) |
| | 0.5 min | | | Δ |

In table 5, the marks have the same meanings as in Tables 3 and 4. The data in Table 5 demonstrates that a natural oxide film having a thickness of about 5 nm can be removed from the substrate surface by carrying out the cleaning treatment for one minute at the flow rate of formic acid gas of 100 sccm or 300 sccm using the claw-type surface treatment apparatus.

Table 6 shows the results of an experiment conducted to determine those conditions of the flow rate of formic acid gas and treatment time which are necessary to remove a natural oxide film from the substrate surface in a cleaning treatment of the substrate surface carried out under the conditions of the substrate temperature of 175° C. and the flow rate of nitrogen gas of 10 slm using the ring-type surface treatment apparatus. Measurement of the substrate surface with an ellipsometer was carried out in the same manner as in the preceding experiments.

TABLE 6

| | | Flow rate of formic acid gas | | |
|---|---|---|---|---|
| | | 30 sccm | 100 sccm | 300 sccm |
| Treatment time | 10 min | (◯) | ◯ | (◯) |
| | 3 min | | Δ | |
| | 1 min | | | Δ |
| | 0.5 min | | | Δ |

In table 6, the marks have the same meanings as in Tables 3 and 4. As can be seen from the data in table 6 in comparison with the date in Table 5, the treatment conditions necessary for the removal of natural oxide film by the ring-type surface treatment apparatus are narrower than those of the claw-type surface treatment apparatus.

Figure 15:
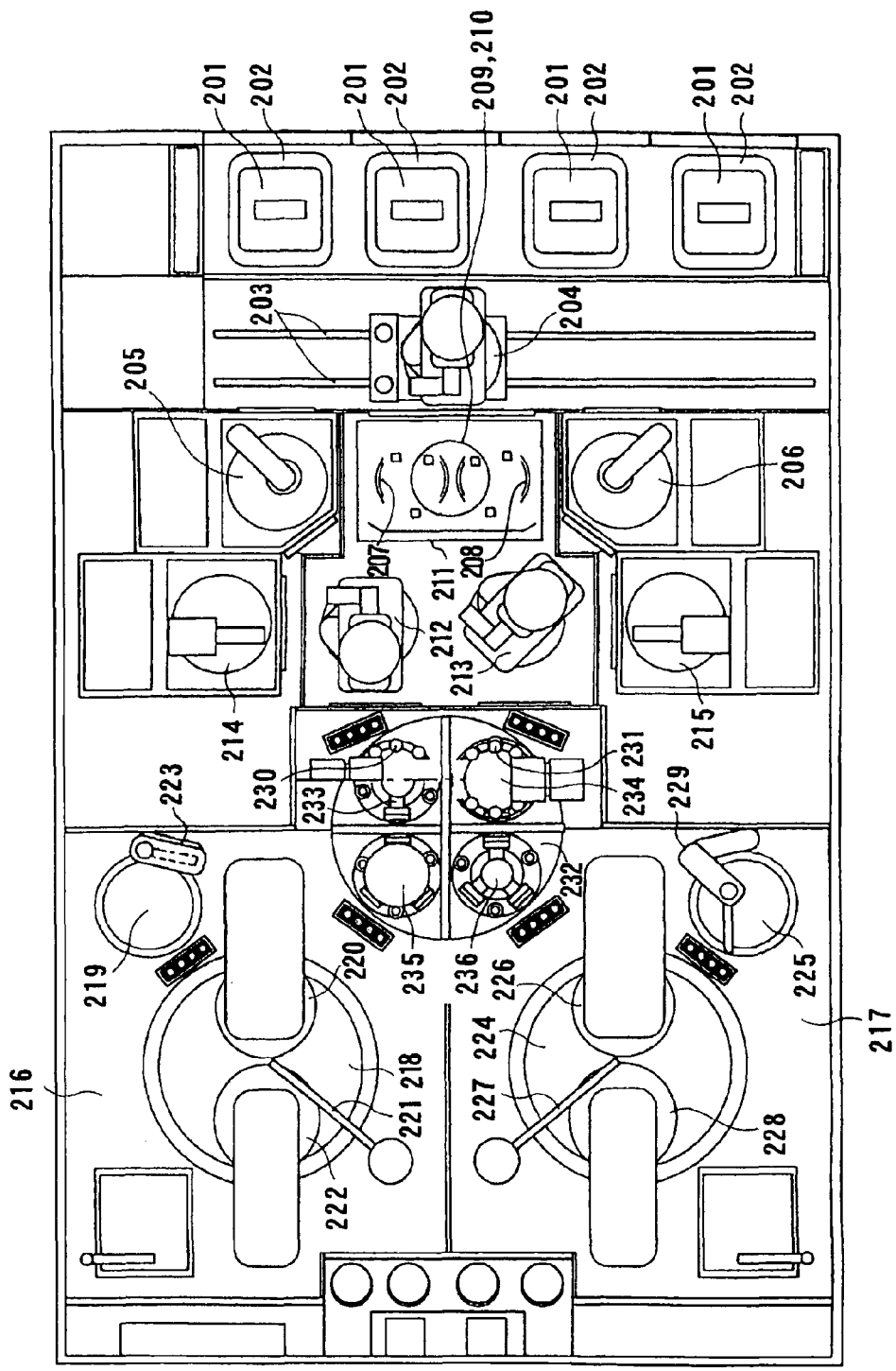
FIG. 15 is an overall plan view of a substrate processing apparatus according to an embodiment of the present invention.

FIG. 15 is a plan view of a substrate processing apparatus according to an embodiment of the present invention. As shown in FIG. 15, the substrate processing apparatus includes four loading/unloading stages 202 each for mounting a substrate cassette 201 that stores a number of substrates. A travel mechanism 203 is provided along the loading/unloading stages 202, and a first transfer robot 204 having two hands is disposed on the travel mechanism 203.

Two cleaning/drying machines 205, 206 are disposed at an opposite side of the substrate cassettes 201 with respect to the travel mechanism 203 of the first transfer robot 204. The cleaning/drying machines 205, 206 are disposed at positions accessible by the hands of the first transfer robot 204. Each of the cleaning/drying machines 205, 206 has a spin-dry mechanism for drying a substrate by spinning the substrate at a high speed. Between the two cleaning/drying machines 205, 206, a substrate station 211 having four substrate supports 207, 208, 209 and 210 is disposed at a position accessible by the hands of the first transfer robot 204.

A second transfer robot 212 having two hands is disposed at a position where hands of the second transfer robot 212 can access the cleaning/drying machine 205 and the three supports 207, 209 and 210, and a third transfer robot 213 having two hands is disposed at a position where hands of the third transfer robot 213 can access the cleaning/drying machine 206 and the three supports 208, 209 and 210. The support 207 is used to transfer a substrate between the first transfer robot 204 and the second transfer robot 212, and the support 208 is used to transfer a substrate between the first transfer robot 204 and the third transfer robot 213. The support 209 is used to transfer a substrate between the second transfer robot 212 and the third transfer robot 213, and the support 210 is used to transfer a substrate between the third transfer robot 213 and the second transfer robot 212. The support 209 is disposed above the support 210.

A surface treatment apparatus 214 as a dry processing unit for removing a natural oxide film on a metal film formed on a surface of a substrate, such as a semiconductor wafer, by dry cleaning is disposed at a position adjacent to the cleaning/drying machine 205 and is accessible by the hands of the second transfer robot 212. The surface treatment apparatus shown in FIGS. 2 and 3, FIG. 6, FIGS. 8 through 10, or FIGS. 11 and 12 is used as this surface treatment apparatus 214. Further, a cleaning machine 215 for cleaning a substrate after polishing is disposed at a position adjacent to the cleaning/drying machine 206 and is accessible by hands of the third transfer robot 213.

The substrate processing apparatus has two chemical mechanical polishing (CMP) apparatuses 216, 217 as flattening units for flattening a metal film of a substrate. Each of chemical mechanical polishing apparatuses 216, 217 has two polishing tables and one top ring for holding and pressing one substrate against the polishing tables to polish the substrate. Specifically, the chemical mechanical polishing apparatus 216 has a first polishing table 218, a second polishing table 219, a top ring 220, a polishing liquid supply nozzle 221 for supplying a polishing liquid onto the polishing table 218, a dresser 222 for dressing the polishing table 218, and a dresser 223 for dressing the polishing table 219. The chemical mechanical polishing apparatus 217 has also a first polishing table 224, a second polishing table 225, a top ring 226, a polishing liquid supply nozzle 227 for supplying a polishing liquid onto the polishing table 224, a dresser 228 for dressing the polishing table 224, and a dresser 229 for dressing the polishing table 229.

The chemical mechanical polishing apparatus 216 is provided with a reversing machine 230 for reversing a substrate at a position accessible by the hands of the second transfer robot 212. The substrate is transferred to the reversing machine 230 by the second transfer robot 212. Similarly, the chemical mechanical polishing apparatus 217 is provided with a reversing machine 231 for reversing a substrate at a position accessible by the hands of the third transfer robot 213. The substrate is transferred to the reversing machine 231 by the third transfer robot 213.

A rotary transporter 232 is disposed below the reversing machines 230, 231 and the top rings 220, 226 to transfer substrates between the reversing machines 230, 231 and the top rings 220, 226. The rotary transporter 232 has four stages for placing substrates at equal angular intervals, and can hold a plurality of substrates thereon at the same time. A substrate is transferred to the rotary transporter 232 by elevating and lowering a lifter 233 or 234 disposed below the rotary transporter 232 when a center of a stage of the rotary transporter 232 is aligned with a center of the substrate held by the reversing machine 230 or 231.

A substrate placed on the stage of the rotary transporter 232 is transported to a position below the top ring 220 or 226 by rotating the rotary transporter 232. At this time, the top ring 220 or 226 is positioned above the rotary transporter 232 beforehand by a swinging motion of the top ring. A substrate held on the stage of the rotary transporter 232 is transferred to the top ring 220 or 226 by elevating and lowering a pusher 235 or 235 disposed below the rotary transporter 232 when a center of the top ring 220 or 226 is aligned with a center of the substrate.

The substrate, which has been transferred to the top ring 220 or 226, is attracted to the top ring 220 or 226 by its vacuum attraction mechanism. The substrate, while kept attracted to the top ring 220 or 226, is transported to the polishing table 218 or 224, and is polished with a polishing surface comprised of a polishing pad, a grindstone or the like mounted on the polishing table 218 or 224. Above-described second polishing tables 219, 225 are disposed respectively at positions accessible by the top rings 220, 226, so that substrates, after completion of the polishing in the first polishing tables 218, 224, can be polished with the second polishing tables 219, 225. The substrate after polishing is returned to the reversing machines 230, 231 by the same root.

The third transfer robot 213 transfers a substrate to the cleaning machine 215, and the substrate is cleaned in the cleaning machine 215. The substrate after cleaning is taken out of the cleaning machine 215 by the third transfer robot 213, and carried in the cleaning/drying machine 206. The substrate is rinsed and dried in the cleaning/drying machine 206, and the dried substrate is returned to substrate cassette 201 by the first transfer robot 204.

A description will now be made of processing (polishing) of a substrate by means of the above-described substrate processing apparatus.

Figure 16:
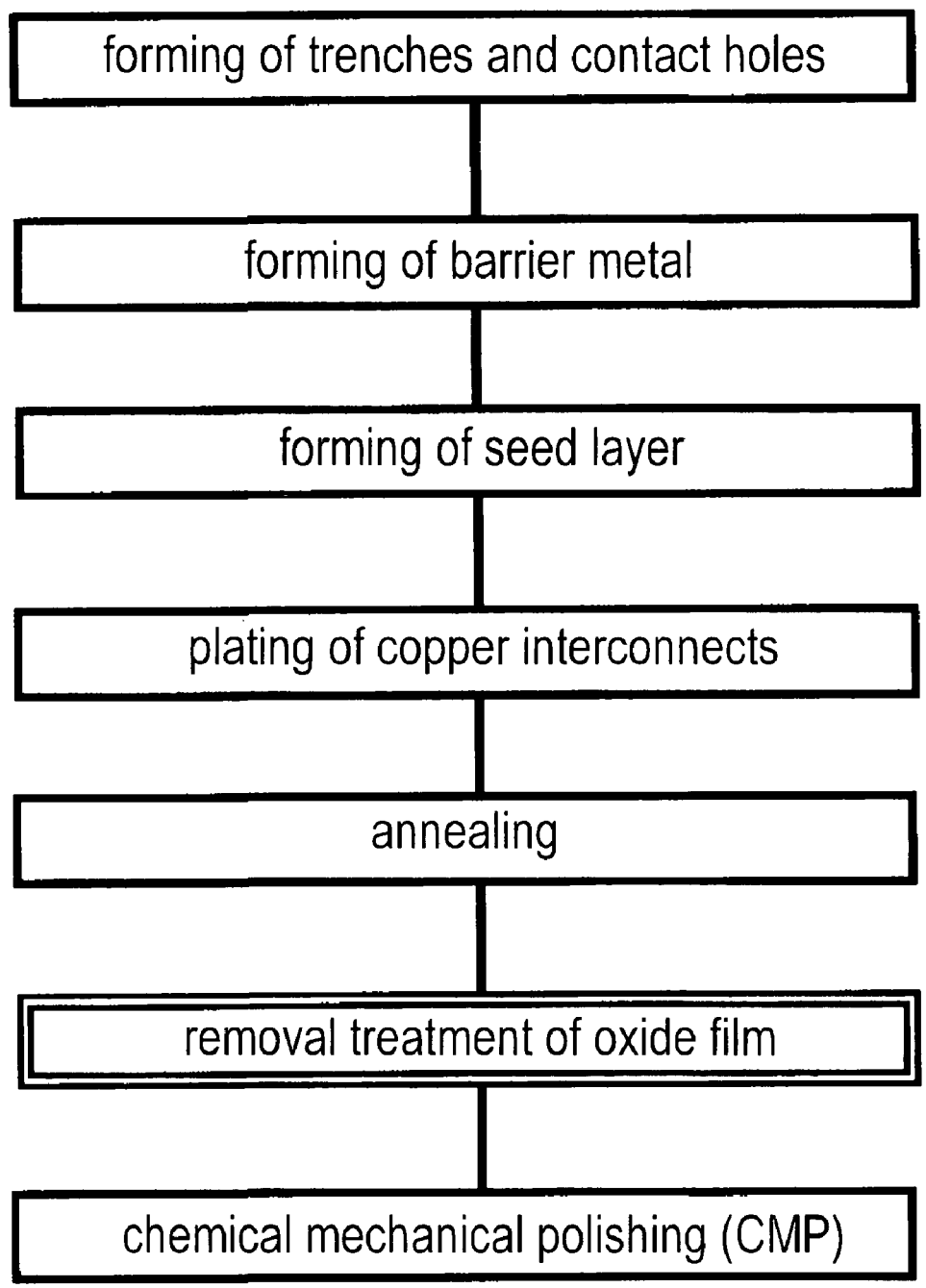
FIG. 16 is a flow chart of a process for the formation of copper interconnects.

FIG. 16 shows a process for the formation of copper interconnects. In particular, interconnect trenches for embedding of upper-level interconnects and connecting holes (via holes) for connecting the upper-level interconnects and lower-level interconnects are formed in an insulating film on the lower-level interconnects, and a barrier metal layer and a seed layer are formed sequentially on the flat portions of the insulating film, on the bottom and side surfaces of the interconnect trenches, and on the bottom and side surfaces of the connecting holes. Next, copper plating of the substrate surface is carried out to form a copper plating film, having a thickness sufficient to fill in the interconnect trenches and the connecting holes, on the substrate surface. After the plating, the metal film (copper plating film) is annealed. Next, a natural oxide film on the metal film is removed, and immediately after the oxide film removal, the substrate surface is subjected to chemical mechanical polishing to polish away a predetermined amount of the metal film, thereby forming the upper-level interconnects composed of copper.

The above-described substrate processing apparatus is used in the above process to remove a natural oxide film on the metal film and to carry out chemical mechanical polishing of the substrate, immediately after the oxide film removal, to polish away a predetermined amount of the metal film.

Returning to FIG. 15, the substrate to be polished is housed in the substrate cassette 201 with the surface of the substrate, having the surface metal film, facing upwardly, and the substrate cassette 201, in which a number of such substrates W are housed, is placed on the loading/unloading stage 202. The first transfer robot 204 takes one substrate out of the substrate cassette 201 and transfers the substrate to the support 207.

The substrate on the support 207 is transferred by the second transfer robot 212 to the surface treatment apparatus 214. A natural oxide film on the metal film of the substrate is removed by a dry treatment as carried out in the above-described manner under atmospheric pressure by the surface treatment apparatus 214.

The substrate after the oxide film removal treatment is taken out of the surface treatment apparatus 214 by the second transfer robot 212 and transferred to the reversing machine 230. The substrate is reversed by the reversing machine 230, and the substrate is transferred to the rotary transporter 232 with the surface of the substrate, having the metal film, facing downwardly. Upon receipt of the substrate, the rotary transporter 232 rotates 90 degrees to transport the substrate to the pusher 235. The substrate on the pusher 235 is attracted to the top ring 220 of the chemical mechanical polishing apparatus 216 and moved onto the polishing table 218, where the substrate is polished. As described above, after polishing the substrate with the first polishing table 218, the substrate may be polished with the second polishing table 225.

The substrate after polishing is transferred from the pusher 235 to the rotary transporter 232. Upon receipt of the substrate, the rotary transporter 232 rotates 180 degrees to transport the substrate to the reversing machine 231. The substrate is reversed by the reversing machine 231, and transferred to the third transfer robot 213 with the surface of the substrate, having the metal film, facing upwardly. The third transfer robot 213 transfers the substrate to the cleaning machine 215, where the substrate is cleaned. The substrate after cleaning is taken out of the cleaning machine 215 by the third transfer robot 213 and transferred to the cleaning/drying machine 206, where the substrate is rinsed, followed by drying. The substrate after drying is returned by the first transfer robot 204 to the substrate cassette 201.

Figure 17:
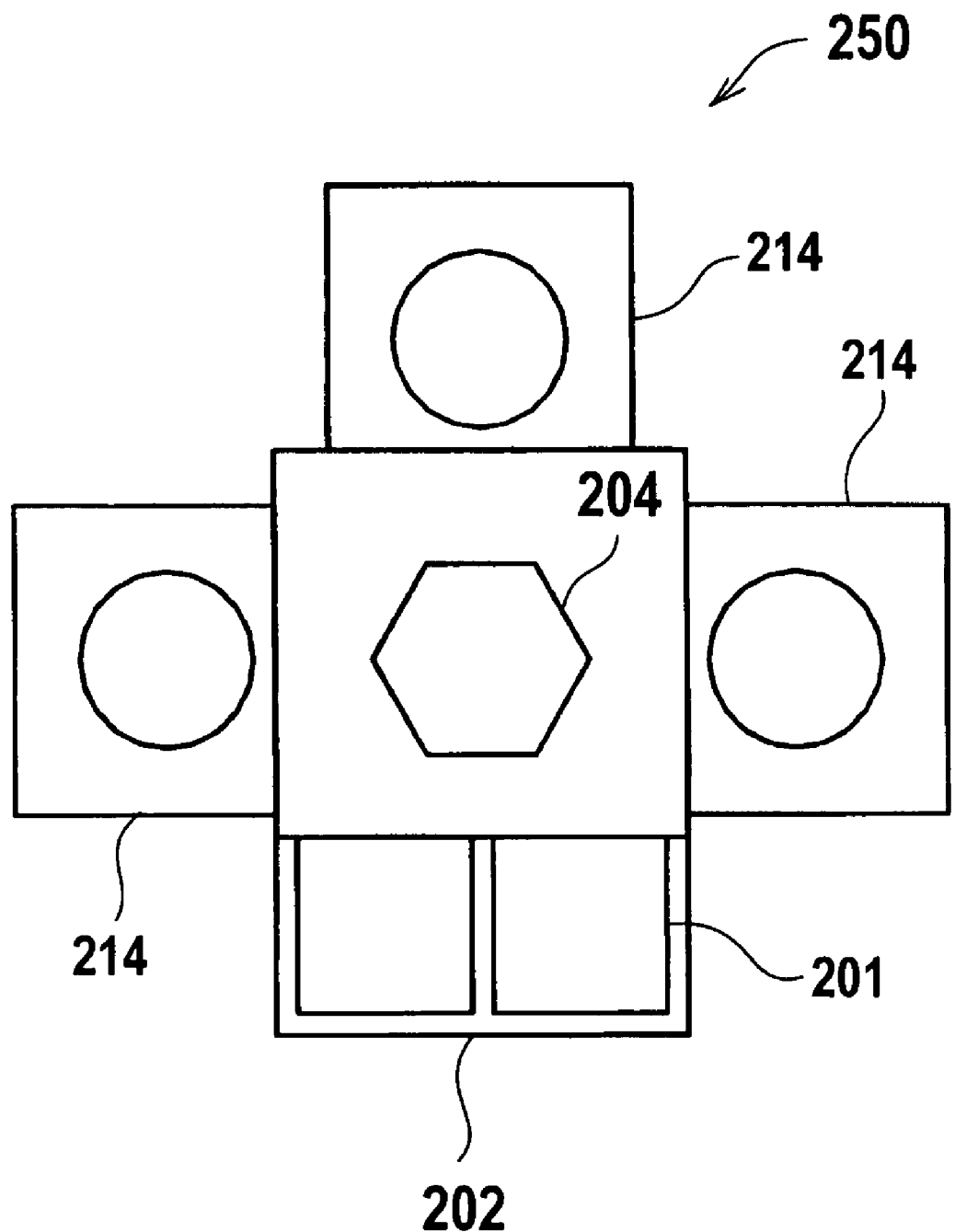
FIG. 17 is a plan view of a surface treatment section of a substrate processing apparatus according to another embodiment of the present invention.

FIG. 17 shows a substrate processing apparatus according to another embodiment of the present invention. The substrate processing apparatus includes a surface treatment section 250 including three surface treatment apparatuses 214 each comprised of any of the above-described surface treatment apparatuses shown in FIGS. 2 and 3, FIG. 6, FIGS. 8 through 10 and FIGS. 11 and 12, and a not-shown chemical mechanical polishing section including the above-described chemical mechanical polishing apparatus. The surface treatment section 250 and the chemical mechanical polishing section are constructed separately and disposed at a distance from each other. In addition to the three surface treatment apparatuses 214, the surface treatment section 250 includes a loading/unloading stage 202 for placing a substrate cassette 201 on it, and a transfer robot 204 disposed in the center of the apparatuses 214 and the stage 202.

According to this embodiment, an oxide film removal treatment by the surface treatment apparatus 214 and a flattening processing by the chemical mechanical polishing apparatus can be carried out independently, enabling highly-flexible operations for the oxide film removal treatment and the flattening processing. It is also possible to carry out a cleaning treatment, e.g., for removal of an oxide film or an organic material, by the surface treatment apparatus after carrying out a flattening processing by the chemical mechanical polishing apparatus.

Figure 18:
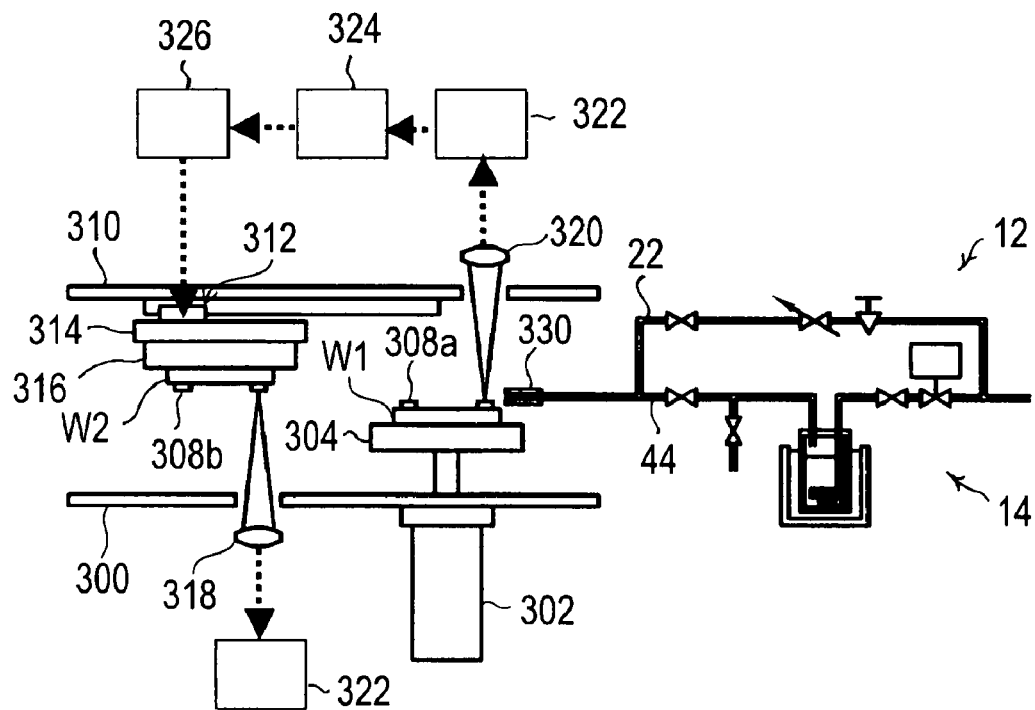
FIG. 18 is a schematic front view of a surface treatment apparatus, having a bonding mechanism, according to yet another embodiment of the present invention, illustrating the apparatus upon holding of a substrate.
Figure 19:
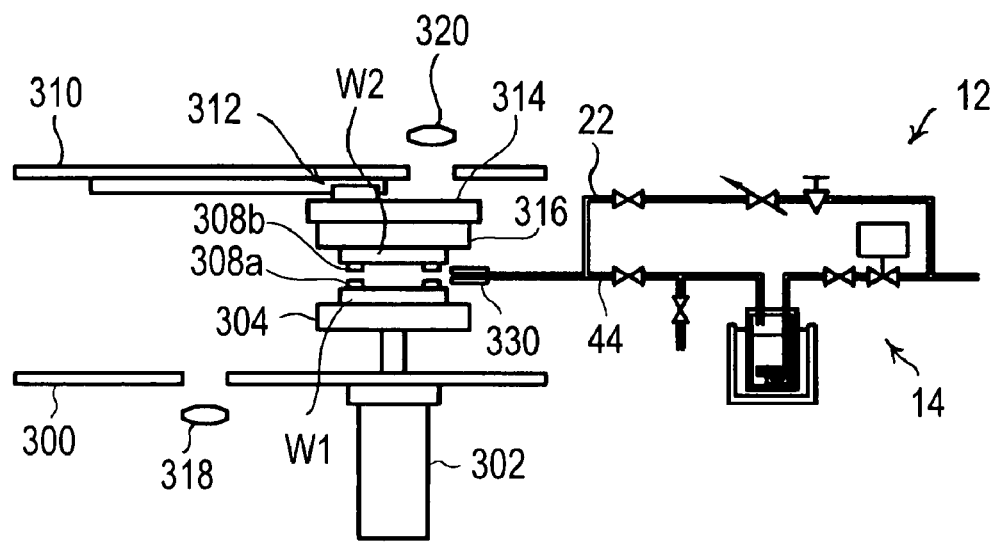
FIG. 19 is a schematic front view of the surface treatment apparatus, having a bonding mechanism, according to yet another embodiment of the present invention, illustrating the apparatus upon a cleaning treatment.
Figure 20:
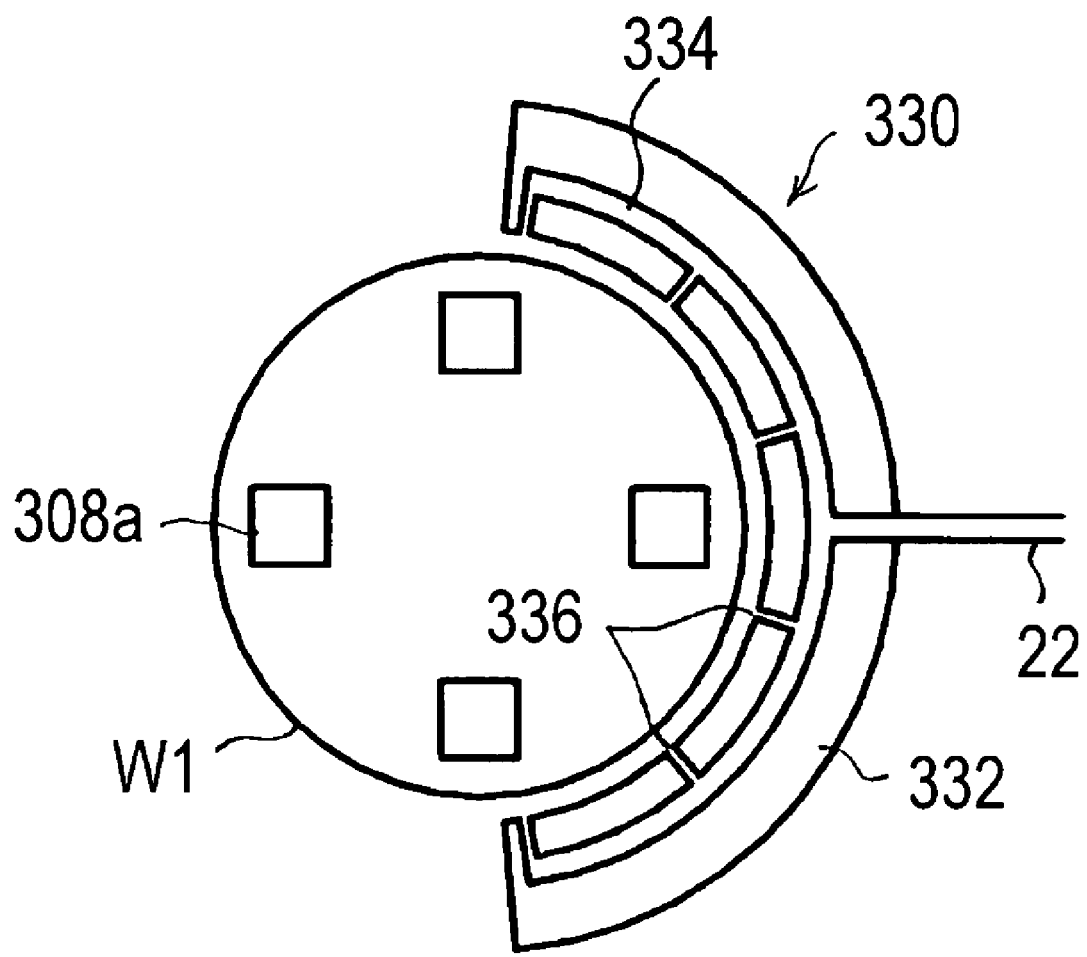
FIG. 20 is a cross-sectional plan view of a gas jet guide of the surface treatment apparatus, having a bonding mechanism, according to yet another embodiment of the present invention.

FIGS. 18 through 20 show a surface treatment apparatus according to yet another embodiment of the present invention, having a bonding function of bonding a bonding portion of one substrate to a corresponding bonding portion of another substrate. The surface treatment apparatus is used to clean the surfaces of bonding portions provided in the surfaces of two substrates with formic acid gas (cleaning gas) in the air, and then bring the bonding portions of the two substrates into pressure contact with each other so bond the bonding portions.

The surface treatment apparatus includes a lower table 300 to which is mounted a press mechanism 302, e.g., comprised of a cylinder, penetrating through the lower table 300 and facing upwardly. A substrate stage 304 is secured to the upper end of a drive shaft (cylinder rod) of the press mechanism 302. The substrate stage 304 has a function of attracting and holding a substrate (hereinafter referred to as "lower substrate W1") with its surface, having bonding portions 308a, facing upwardly, a heating function of heating the lower substrate W1 held on it, and a cooling function of cooling the lower substrate W1 near to room temperature.

An upper table 310 is disposed above and parallel to the lower table 300. To the lower surface of the upper table 310 are mounted a position adjustment mechanism 314 and a substrate stage 316 which are slidable by a slide mechanism 312. Similarly to the substrate stage 304, the substrate stage 316 has a function of attracting and holding a substrate (hereinafter referred to as "upper substrate W2") with its surface, having bonding portions 308b, facing downwardly, a heating function of heating the upper substrate W2 held on it, and a cooling function of cooling the upper substrate W2 near to room temperature. The substrate stage 316 slides between a substrate receiving position and a position right above the substrate stage 304 by the slide mechanism 312. The position adjustment mechanism 314 functions to adjust the position of the upper substrate W2, attracted and held by the substrate stage 316, in X, Y and θ directions.

The position adjustment mechanism 314, if provided on the lower substrate stage 304 side, will produce the same effect.

Below the lower table 300 is disposed a position detection section 318 which functions to detect the positions of the bonding portions 308b of the upper substrate W2, attracted and held by the substrate stage 316, through a through-hole provided in the lower table 300. Similarly, above the upper table 310 is disposed a position detection section 320 which functions to detect the positions of the bonding portions 308a of the lower substrate W1, attracted and held by the substrate stage 304, through a through-hole provided in the upper table 310. Signals from the two position detection sections 318, 320 are sent to a position arithmetic unit 322, and the arithmetic results of the position arithmetic unit 322 are sent to a position adjustment arithmetic unit 324. The position adjustment arithmetic unit 324 sends an adjustment signal, which ensures precise alignment upon bonding of the bonding portions 308a, 308b of the two substrates W1, W2, to the position adjustment mechanism 314 via an adjustment output unit 326, and the position adjustment mechanism 314 corrects the position of the substrate W2 attracted and held by the substrate stage 316.

Lateral to the substrate stage 304 is disposed a gas jet guide 330 which is connected to the front end of an inert gas pipe 22 having a similar construction to that shown in FIG. 8. A cleaning gas pipe 44, having a similar construction to that shown in FIG. 8, joins the inert gas pipe 22. Thus, nitrogen gas (inert gas), supplied from an inert gas supply section 12 having a similar construction to that shown in FIG. 8, and a mixed gas of formic acid gas (cleaning gas) and nitrogen gas, supplied from a cleaning gas supply section 14 having a similar construction to that shown in FIG. 8, are passed through the inert gas pipe 22 and jetted laterally from the gas jet guide 330.

As shown in FIG. 20, the gas jet guide 330 includes an arc-shaped body 332 that surrounds about half of the circumference of the substrate W1 attracted and held by the substrate stage 304. The body 332 has, in its interior, a guide groove 334 communicating with the inert gas pipe 22 and extending in an arc, and a plurality of jet orifices 336, communicating with the guide groove 334 and opening on the inner circumferential surface of the body 332, arranged at regular intervals along the length direction of the guide groove 334, so that a treating gas can be jetted uniformly from the jet orifices 336 toward the lower substrate W1 attracted and held by the substrate stage 304, and also toward the upper substrate W2 attracted and held by the substrate stage 316.

The construction of the gas jet guide 332 is, of course, not limited to the one described above; and any desired shape of gas jet guide may be used.

The surface material of the bonding portions 308a provided in the lower substrate W1 and the surface material of the bonding portions 308b provided in the upper substrate W2 typically are copper.

The thus-constructed surface treatment apparatus having a boding function operates as follows.

As shown in FIG. 18, the lower substrate W1, which has been carried in by a not-shown transport means, is attracted and held by the substrate stage 304 with the substrate surface, having the bonding portions 308a, facing upwardly. Similarly, the upper substrate W2, which has been carried in by a not-shown transport means, is attracted and held by the substrate stage 316 with the substrate surface, having the bonding portions 308b, facing downwardly. Next, the positions of the bonding portions 308b of the upper substrate W2 are measured with the position detection section 318, and the positions of the bonding portions 308a of the lower substrate W1 are measured with the position detection section 320. The position arithmetic unit 322 calculates the positions, and then the position adjustment arithmetic unit 324 calculates a positional correction.

Next, as shown in FIG. 19, the upper substrate stage 316 is moved by the slide mechanism 312 to a position where the upper substrate W2 attracted and held by the substrate stage 316 faces the lower substrate W1 attracted and held by the lower substrate stage 304. The distance between the substrates W1, W2 facing each other has been set at a distance suited for cleaning treatment, for example, about 2 mm. A positional correction signal is sent from the position adjustment arithmetic unit 324 to the adjustment output unit 326 and, based on the information, the position adjustment mechanism 314 is operated to correct the position of the upper substrate W2 attracted and held by the substrate stage 316.

Next, nitrogen gas (inert gas) is passed through the inert gas pipe 22 and the gas jet guide 330 and supplied between the substrates W1, W2, thereby keeping the concentration of oxygen present between the substrates W1, W2 at a low concentration which will not adversely affect the removal of an oxide film. While continuing the supply of nitrogen gas (inert gas), the temperatures of the substrates W1, W2 are raised to an appropriate temperature in the range of 150-250° C. by using the heating functions of the substrate stages 304, 316. When the temperatures of the substrates W1, W2 have reached a predetermined temperature, the cleaning gas supply section 14 is operated to supply a mixed gas of formic acid gas (cleaning gas) and nitric acid gas between the substrates W1, W2. The supply of the mixed gas of formic acid gas (cleaning gas) and nitric acid gas is continued for a predetermined time, thereby removing an oxide film from the surfaces of the bonding portions 308a, 308b of the substrates W1, W2.

Next, while continuing the supply of nitrogen gas (inert gas), the supply of formic acid gas (mixed with nitrogen gas) is stopped, and the heating functions of the substrate stages 304, 316 are stopped. The press mechanism 302 is then operated to raise the lower substrate stage 304 so as to bring the bonding portions 308a of the lower substrate W1 into pressure contact with the bonding portions 308b of the upper substrate W2, thereby bonding the bonding portions 308a and 308b. The pressure applied on the bonding portions 308a, 308b from the press mechanism 302 is a predetermined one which has been determined experimentally to be appropriate to the number and the bonding area of the bonding portions 308a, 308b. After pressing on the bonding portions 308a, 308b for a predetermined time, the substrates W1, W2 are cooled by using the cooling functions of the substrate stages 304, 316.

After cooling the substrates W1, W2, the attracting function of the upper substrate stage 316 is stopped, and then the lower substrate stage 304 is lowered by the press mechanism 302, whereupon the bonded substrates W1, W2 are placed on the lower substrate stage 304.

The upper substrate stage 316 is then moved to the substrate receiving position shown in FIG. 18 by the slide mechanism 312. Thereafter, the attracting function of the substrate stage 304 is stopped, and the bonded substrates W1, W2 are carried out of the lower substrate stage 304, whereby the series of bonding operations is completed.

According to the substrate processing apparatus having the above-described bonding function, cleaning of the bonding surfaces of bonding portions provided in two substrates and bonding of the bonding portions between the substrates can be carried out in the air with a relatively simple apparatus construction, not requiring the use of a vacuum evacuation means, and without the use of an auxiliary material, such as a wax material.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. An apparatus for surface treatment of a substrate, comprising:
an inert gas supply section for supplying an inert gas to the whole or part of a substrate surface to form an oxygen-blocking zone between the inert gas supply section and the substrate surface, the oxygen-blocking zone being configured to block out oxygen with the inert gas and being substantially free of oxygen;
a heating section for keeping the substrate surface at a predetermined temperature;
a cleaning gas supply section for supplying a cleaning gas to the oxygen-blocking zone to clean the substrate surface while the inert gas supply section supplies the inert gas to form the oxygen-blocking zone; and
a cylindrical gas flow regulating mechanism configured to surround the oxygen-blocking zone and guide a flow of the cleaning gas in the oxygen-blocking zone, the gas flow regulating mechanism having only a lateral side wall with no top wall and no bottom wall.

2. The surface treatment apparatus according to claim 1, further comprising:
a cooling section for cooling the substrate after the cleaning of the substrate surface.

3. The surface treatment apparatus according to claim 1, wherein the cleaning gas is a carboxylic acid gas or a reducing gas.

4. The surface treatment apparatus according to claim 1 further, comprising:
a gas discharge section for discharging gas from the gas flow regulating mechanism.

5. The surface treatment apparatus according to claim 1, further comprising a shower head having a plurality of jet orifices formed therein, the shower head being connected to a downstream end of the inert gas supply section and a downstream end of the cleaning gas supply section, and the jet orifices are shaped and arranged to maintain the oxygen-blocking zone formed by the flow of the inert gas from the inert gas supply section while also supplying the cleaning gas to the oxygen-blocking zone from the cleaning gas supply section.

* * * * *